US007234584B2

(12) United States Patent
Rice et al.

(10) Patent No.: US 7,234,584 B2
(45) Date of Patent: Jun. 26, 2007

(54) SYSTEM FOR TRANSPORTING SUBSTRATE CARRIERS

(75) Inventors: Michael Robert Rice, Pleasanton, CA (US); Robert B. Lowrance, Los Gatos, CA (US); Martin R. Elliott, Round Rock, TX (US); Jeffrey C. Hudgens, San Francisco, CA (US); Eric A. Englhardt, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/650,310

(22) Filed: Aug. 28, 2003

(65) Prior Publication Data

US 2004/0062633 A1 Apr. 1, 2004

Related U.S. Application Data

(60) Provisional application No. 60/443,004, filed on Jan. 27, 2003, provisional application No. 60/443,087, filed on Jan. 27, 2003, provisional application No. 60/443,153, filed on Jan. 27, 2003, provisional application No. 60/443,001, filed on Jan. 27, 2003, provisional application No. 60/443,115, filed on Jan. 27, 2003, provisional application No. 60/407,451, filed on Aug. 31, 2002, provisional application No. 60/407,339, filed on Aug. 31, 2002, provisional application No. 60/407,474, filed on Aug. 31, 2002, provisional application No. 60/407,336, filed on Aug. 31, 2002, provisional application No. 60/407,452, filed on Aug. 31, 2002, provisional application No. 60/407,337, filed on Aug. 31, 2002, provisional application No. 60/407,340, filed on Aug. 31, 2002, provisional application No. 60/407,463, filed on Aug. 31, 2002.

(51) Int. Cl.
*B65G 29/00* (2006.01)

(52) U.S. Cl. .............................. 198/465.1; 198/465.4; 198/346.3

(58) Field of Classification Search .............. 198/465.1, 198/575, 465.4, 577, 468.6, 346.1, 346.2, 198/346.3; 414/940, 217
See application file for complete search history.

(56) References Cited

U.S. PATENT DOCUMENTS 1,639,758 A * 8/1927 Webb ...................... 198/468.6

(Continued)

FOREIGN PATENT DOCUMENTS

EP 0 277 536 A 8/1988

(Continued)

OTHER PUBLICATIONS

Virvalo, T.K., "Cylinder Speed Synchronization", Dec. 1978, Hydraulics and Pneumatics, vol. 31, No. 12, pp. 55-57.

(Continued)

*Primary Examiner*—James R. Bidwell
(74) *Attorney, Agent, or Firm*—Dugan & Dugan

(57) ABSTRACT

In a semiconductor fabrication facility, a conveyor transports substrate carriers. The substrate carriers are unloaded from the conveyor and loaded onto the conveyor without stopping the conveyor. A load and/or unload mechanism lifts the substrate carriers from the conveyor during unloading operations, while matching the horizontal speed of the conveyor. Similarly, during loading operations, the load/unload mechanism lowers a substrate carrier into engagement with the conveyor while matching the horizontal speed of the conveyor. Individual substrates, without carriers, may be similarly loaded and/or unloaded from a conveyor.

23 Claims, 30 Drawing Sheets

U.S. PATENT DOCUMENTS

| | | | |
|---|---|---|---|
| 1,906,036 A * | 4/1933 | Wunderlich | 198/468.6 |
| 2,153,071 A * | 4/1939 | Bishop | 198/465.4 |
| 2,949,996 A * | 8/1960 | Tonelli | 198/465.4 |
| 3,058,604 A * | 10/1962 | Harper et al. | 198/465.4 |
| 3,131,801 A * | 5/1964 | Marchetti | 198/468.6 |
| 3,184,032 A * | 5/1965 | Jonsson | 198/468.6 |
| 3,587,817 A * | 6/1971 | Bornstein et al. | 198/468.6 |
| 3,610,448 A * | 10/1971 | Bornfleth | 198/468.6 |
| 3,710,921 A | 1/1973 | Petiet | |
| 3,710,923 A | 1/1973 | Fromme et al. | |
| 3,722,656 A | 3/1973 | Loomis, Jr. et al. | |
| 3,734,263 A | 5/1973 | Dirks | |
| 3,815,723 A | 6/1974 | Wright et al. | |
| 3,845,286 A | 10/1974 | Aronstein et al. | |
| 3,901,376 A | 8/1975 | Dardaine et al. | |
| 3,990,569 A | 11/1976 | Aiuola | |
| 4,006,813 A | 2/1977 | Fluck | |
| 4,027,246 A | 5/1977 | Caccoma et al. | |
| 4,029,194 A | 6/1977 | Feurstein et al. | |
| 4,033,403 A | 7/1977 | Seaton et al. | |
| 4,040,302 A | 8/1977 | Katarao | |
| 4,044,886 A | 8/1977 | Sender | |
| 4,166,527 A | 9/1979 | Beezer | |
| 4,222,479 A | 9/1980 | Dugan et al. | |
| 4,261,236 A | 4/1981 | Verjux | |
| 4,266,652 A | 5/1981 | Bald | |
| 4,294,344 A | 10/1981 | van Maanen | |
| 4,340,137 A | 7/1982 | Foster | |
| 4,401,522 A | 8/1983 | Buschow et al. | |
| 4,450,950 A | 5/1984 | Foote, Jr. | |
| 4,506,779 A | 3/1985 | Seragnoli | |
| 4,524,858 A | 6/1985 | Maxey | |
| 4,534,843 A | 8/1985 | Johnson et al. | |
| 4,538,720 A | 9/1985 | Limousin | |
| 4,540,088 A | 9/1985 | Bergh | |
| 4,549,647 A | 10/1985 | Cosse | |
| 4,552,261 A | 11/1985 | Raudat et al. | |
| 4,584,944 A | 4/1986 | Dehne | |
| 4,585,126 A | 4/1986 | Paddock et al. | |
| 4,603,770 A | 8/1986 | Hartness | |
| 4,650,264 A | 3/1987 | Dahnert | |
| 4,653,630 A | 3/1987 | Bravin | |
| 4,667,809 A | 5/1987 | Raybuck | |
| 4,679,685 A | 7/1987 | Inoko | |
| 4,680,919 A | 7/1987 | Hirama et al. | |
| 4,693,359 A | 9/1987 | Mattei et al. | |
| 4,702,365 A | 10/1987 | Pak | |
| 4,708,727 A | 11/1987 | Cardenas-Franco et al. | |
| 4,720,006 A | 1/1988 | Lenherr | |
| 4,730,733 A * | 3/1988 | Kawamura et al. | 198/468.6 |
| 4,750,605 A | 6/1988 | Brems et al. | |
| 4,759,439 A | 7/1988 | Hartlepp | |
| 4,765,453 A | 8/1988 | Bucher | |
| 4,775,046 A | 10/1988 | Gramarossa et al. | |
| 4,805,759 A | 2/1989 | Rochet et al. | |
| 4,813,528 A | 3/1989 | Hartlepp | |
| 4,830,180 A | 5/1989 | Ferguson et al. | |
| 4,850,102 A | 7/1989 | Hironaka et al. | |
| 4,852,717 A | 8/1989 | Ross et al. | |
| 4,854,440 A | 8/1989 | Laube et al. | |
| 4,869,637 A | 9/1989 | deGroot | |
| 4,898,373 A | 2/1990 | Newsome | |
| 4,901,843 A | 2/1990 | Lashyro | |
| 4,921,092 A | 5/1990 | Crawford et al. | |
| 4,936,438 A * | 6/1990 | Waineo | 198/468.6 |
| 5,048,164 A | 9/1991 | Harima | |
| 5,052,544 A | 10/1991 | Anderson | |
| 5,086,909 A | 2/1992 | Powell, Jr. | |
| 5,092,450 A | 3/1992 | Schommartz et al. | |
| 5,099,896 A | 3/1992 | Ritola | |
| 5,110,249 A | 5/1992 | Norman | |
| 5,113,992 A | 5/1992 | Sadamori | |
| 5,123,518 A | 6/1992 | Pfaff | |
| 5,135,102 A | 8/1992 | Sjogren et al. | |
| 5,184,712 A | 2/1993 | Leypold et al. | |
| 5,207,309 A | 5/1993 | Simpkin et al. | |
| 5,226,211 A | 7/1993 | Jones | |
| 5,231,926 A | 8/1993 | Williams et al. | |
| 5,256,204 A | 10/1993 | Wu | |
| 5,261,935 A | 11/1993 | Ishii et al. | |
| 5,269,119 A | 12/1993 | Tolson | |
| 5,275,275 A | 1/1994 | Boldrini et al. | |
| 5,332,013 A | 7/1994 | Sugita et al. | |
| 5,341,915 A | 8/1994 | Cordia et al. | |
| 5,372,471 A | 12/1994 | Wu | |
| 5,382,127 A | 1/1995 | Garric et al. | |
| 5,388,945 A | 2/1995 | Garric et al. | |
| 5,390,785 A | 2/1995 | Garric et al. | |
| 5,411,358 A | 5/1995 | Garric et al. | |
| 5,439,091 A | 8/1995 | Mason | |
| 5,460,478 A | 10/1995 | Akimoto et al. | |
| 5,558,198 A | 9/1996 | Juarez | |
| 5,560,471 A | 10/1996 | Prochut et al. | |
| 5,570,990 A | 11/1996 | Bonora et al. | |
| 5,603,777 A | 2/1997 | Ohashi | |
| 5,612,886 A | 3/1997 | Weng | |
| 5,617,944 A | 4/1997 | McTaggart | |
| 5,628,614 A | 5/1997 | Pazdernik et al. | |
| 5,653,327 A | 8/1997 | Buday, Jr. et al. | |
| 5,664,254 A | 9/1997 | Ohkura et al. | |
| 5,667,056 A | 9/1997 | Kimmet | |
| 5,668,056 A | 9/1997 | Wu et al. | |
| 5,762,544 A | 6/1998 | Zuniga et al. | 451/128 |
| 5,782,338 A | 7/1998 | Schuster et al. | |
| 5,797,249 A | 8/1998 | Hartness | |
| 5,818,716 A | 10/1998 | Chin et al. | |
| 5,823,319 A | 10/1998 | Resnick et al. | |
| 5,827,118 A | 10/1998 | Johnson et al. | |
| 5,829,574 A | 11/1998 | DelSanto | |
| 5,829,939 A | 11/1998 | Iwai et al. | |
| 5,865,292 A | 2/1999 | Aguilar et al. | |
| 5,884,392 A | 3/1999 | Lafond | |
| 5,887,701 A | 3/1999 | Spatafora | |
| 5,888,042 A | 3/1999 | Oda | |
| 5,957,648 A | 9/1999 | Bachrach | |
| 5,976,199 A | 11/1999 | Wu et al. | |
| 5,980,183 A | 11/1999 | Fosnight | |
| 6,026,561 A | 2/2000 | Lafond | |
| 6,036,426 A | 3/2000 | Hillman | |
| 6,048,259 A | 4/2000 | Asai | |
| 6,054,181 A | 4/2000 | Nanbu et al. | |
| 6,082,948 A | 7/2000 | Fishkin et al. | |
| 6,083,566 A | 7/2000 | Whitesell | |
| 6,092,979 A | 7/2000 | Miselli | |
| 6,183,186 B1 | 2/2001 | Howells et al. | |
| 6,209,710 B1 | 4/2001 | Mueller et al. | |
| 6,223,887 B1 | 5/2001 | Andou | |
| 6,227,345 B1 | 5/2001 | Miyamoto | |
| 6,227,346 B1 | 5/2001 | Lecomte et al. | |
| 6,227,348 B1 | 5/2001 | Frei et al. | |
| 6,234,300 B1 | 5/2001 | De Vos et al. | |
| 6,235,634 B1 | 5/2001 | White et al. | |
| 6,283,692 B1 | 9/2001 | Perlov et al. | |
| 6,309,279 B1 | 10/2001 | Bowman et al. | |
| 6,435,331 B1 | 8/2002 | Olson et al. | |
| 6,439,822 B1 | 8/2002 | Kimura et al. | |
| 6,440,178 B2 | 8/2002 | Berner et al. | |
| 6,511,065 B1 | 1/2003 | Cote et al. | |
| 6,524,463 B2 | 2/2003 | Gramarossa et al. | |
| 6,579,052 B1 | 6/2003 | Bonora et al. | |
| 6,581,750 B1 | 6/2003 | Tweedy et al. | |
| 6,699,329 B2 * | 3/2004 | Mueller et al. | 198/465.4 |
| 6,826,986 B2 | 12/2004 | Lim et al. | |
| 6,919,001 B2 * | 7/2005 | Fairbairn et al. | 414/217 |

| | | | |
|---|---|---|---|
| 2002/0090282 A1 | 7/2002 | Bachrach | |
| 2003/0010449 A1 | 1/2003 | Gramarossa et al. | |
| 2004/0062633 A1 | 4/2004 | Rice et al. | |
| 2004/0076496 A1 | 4/2004 | Elliott et al. | |
| 2004/0076596 A1 | 4/2004 | Elliott et al. | |
| 2004/0081538 A1 | 4/2004 | Rice et al. | |
| 2004/0081545 A1 | 4/2004 | Elliott et al. | |
| 2004/0082546 A1 | 4/2004 | Elliott et al. | |
| 2004/0191030 A1 | 9/2004 | Rice et al. | |
| 2004/0193300 A1 | 9/2004 | Rice et al. | |
| 2005/0095110 A1 | 5/2005 | Lowrance et al. | |
| 2005/0273191 A1 | 12/2005 | Englhardt et al. | |

FOREIGN PATENT DOCUMENTS

| | | | |
|---|---|---|---|
| EP | 0 365 589 B1 | | 9/1992 |
| EP | 0 582 019 A1 | | 2/1994 |
| EP | 0 663 686 A1 | | 7/1995 |
| EP | 0717717 B1 | | 7/1999 |
| EP | 00735927 B1 | | 11/1999 |
| EP | 0 987 750 A1 | | 3/2000 |
| EP | 00912426 B1 | | 8/2000 |
| EP | 1 134 641 A1 | | 9/2001 |
| JP | 63-020151 | | 1/1988 |
| JP | 02098157 A | | 4/1990 |
| JP | 10-256346 | * | 9/1998 |
| JP | 00062949 A | | 2/2000 |
| JP | 00335799 A | | 12/2000 |
| WO | WO 97/09256 A1 | | 3/1997 |
| WO | WO 99/64207 | | 12/1999 |
| WO | WO 00/69724 A1 | | 11/2000 |
| WO | WO 02/19392 A1 | | 3/2002 |

OTHER PUBLICATIONS

Cheng, et al., "Adaptive Synchronization Control of a Robotic Manipulator Operating in an Intelligent Workcell", Apr. 1990, IEEE Transactions on Industrial Electronics, vol. 37, No. 2, pp. 119-126.

Shih-Hung Li, et al. "An Ultrahigh Speed Assembly Robot System. Part I. Design", 1994, Proceedings 1994 Japan-U.S.A. Symposium on Flexible Automation—A Pacific Rim Conference, vol. 2, pp. 465-472.

Roberts, et al., "Feed Chute Geometry for Minimum Belt Wear", Sep. 1998, 6th International Conference on Bulk Materials Storage, Handling and Transportation, pp. 153-159.

Saigo, et al., "Drive Control Systems for Processing Lines", Nov. 10, 2000, Fuji Jiho (Fuji Electric Journal), vol. 73, No. 11, pp. 45-49, Japanese language (Abstract only).

Saigo, K., "Variable-speed Drive Systems for Industrial Plants", Nov. 10, 2000, Fuji Jiho (Fuji Electric Journal), vol. 73, No. 11, pp. 10-14, Japanese language (Abstract only).

Park, et al., "Task Sequence Optimization for a Dual-Robot Assembly System using Evolutionary Algorithms", 2001, Proceedings of the Institution of Mechanical Engineers, Part B (Journal of Engineering Manufacture), vol. 215, No. B6, pp. 835-846.

* cited by examiner

SYSTEM FOR TRANSPORTING SUBSTRATE CARRIERS

This application claims priority from U.S. provisional application Ser. No. 60/407,451, filed Aug. 31, 2002, the content of which is hereby incorporated by reference herein in its entirety.

FIELD OF THE INVENTION

The present invention relates generally to semiconductor device fabrication systems, and is more particulary concerned with transportation of substrate carriers within a fabrication facility for fabricating substrates such as semiconductor substrates, glass plates and the like.

CROSS REFERENCE TO RELATED APPLICATIONS

The present application is related to the following commonly-assigned, co-pending U.S. Patent Applications, each of which is hereby incorporated by reference herein in its entirety:

U.S. Provisional Patent Application Ser. No. 60/407,339, filed Aug. 31, 2002 and titled "Method and Apparatus for Using Wafer Carrier Movement to Actuate Wafer Carrier Door Opening/Closing";

U.S. Provisional Patent Application Ser. No. 60/407,474, filed Aug. 31, 2002 and titled "Method and Apparatus for Unloading Wafer Carriers from Wafer Carrier Transport System";

U.S. Provisional Patent Application Ser. No. 60/407,336, filed Aug. 31, 2002 and titled "Method and Apparatus for Supplying Wafers to a Processing Tool".

U.S. Provisional Patent Application Ser. No. 60/407,452, filed Aug. 31, 2002 and titled "End Effector Having Mechanism For Reorienting A Wafer Carrier Between Vertical And Horizontal Orientations";

U.S. Provisional Patent Application Ser. No. 60/407,337, filed Aug. 31, 2002, and titled "Wafer Loading Station with Docking Grippers at Docking Stations";

U.S. Provisional Patent Application Ser. No. 60/407,340, filed Aug. 31, 2002 and titled "Wafer Carrier having Door Latching and Wafer Clamping Mechanisms";

U.S. patent application Ser. No. 60/407,463, filed Aug. 31, 2002 and titled "Wafer Carrier Handler That Unloads Wafer Carriers Directly From a Moving Conveyor";

U.S. patent application Ser. No. 60/443,004, filed Jan. 27, 2003 and titled "Wafer Carrier Handler That Unloads Wafer Carriers Directly From a Moving Conveyor";

U.S. Provisional Patent Application Ser. No. 60/443,087, filed Jan. 27, 2003 and titled "Methods and Apparatus for Transporting Wafer Carriers";

U.S. Provisional Patent Application Ser. No. 60/443,153, filed Jan. 27, 2003 and titled "Overhead Transfer Flange and Support for Suspending Wafer Carrier";

U.S. Provisional Patent Application Ser. No. 60/443,001, filed Jan. 27, 2003 and titled "Systems and Methods for Transferring Wafer Carriers Between Processing Tools"; and U.S. Provisional Patent Application Ser. No. 60/443,115, filed Jan. 27, 2003 and titled "Apparatus and Method for Storing and Loading Wafer Carriers".

BACKGROUND OF THE INVENTION

Manufacturing of semiconductor devices typically involves performing a sequence of procedures with respect to a substrate such as a silicon substrate, a glass plate, etc. (Such substrates may also be referred to as wafers, whether patterned or unpatterned.) These steps may include polishing, deposition, etching, photolithography, heat treatment, and so forth. Usually a number of different processing steps may be performed in a single processing system or "tool" which includes a plurality of processing chambers. However, it is generally the case that other processes are required to be performed at other processing locations within a fabrication facility, and it is accordingly necessary that substrates be transported within the fabrication facility from one processing tool to another. Depending upon the type of semiconductor device to be manufactured, there may be a relatively large number of processing steps required to be performed at a considerable number of different processing tools/locations within the fabrication facility.

It is conventional to transport substrates from one processing location to another via substrate carriers such as sealed pods, cassettes, containers or open trays or cassettes and so forth. It is also conventional to employ automated substrate carrier transport devices, such as automatic guided vehicles, overhead transport systems, substrate carrier handling robots, etc., to move substrate carriers from tool to tool within the fabrication facility or to transfer substrate carriers from or to a substrate carrier transport device.

For an individual substrate, the total device fabrication process, from formation of the substrate to cutting of individual semiconductor devices from the finished substrate, may require an elapsed time that is measured in weeks or months. Accordingly it would be desirable to reduce substrate transfer time in an effort to reduce non-value added time.

SUMMARY OF THE INVENTION

The present invention provides for unloading substrate carriers (or the substrates carried thereby) from, and loading substrate carriers (or the substrates carried thereby) on, a substrate carrier transport system while the substrate carriers are moving along the transport system. Consequently, the transport system may run continuously, permitting a substrate fabrication facility to operate with improved efficiency.

According to a first aspect of the invention, a substrate carrier transport system is provided. The transport system according to this aspect of the invention may include a conveyor adapted to transport a substrate carrier, and a load/unload mechanism adapted to load and/or unload the substrate carrier from the conveyor while the conveyor is moving the substrate carrier.

In at least one embodiment, the unload mechanism may be adapted to substantially match a velocity at which the substrate carrier is transported by the conveyor. As used herein, "substantially matches" means sufficiently matches so that a substrate carrier may be unloaded from and/or loaded onto a moving conveyor (e.g., on a carrier engagement member thereof) without damaging a substrate contained within the substrate carrier or generating potentially damaging particles.

According to a second aspect of the invention, a method of operating a substrate carrier transport system is provided. The inventive method according to this aspect of the invention includes using a conveyor to move a substrate carrier and, while the substrate carrier is moving therealong, unloading the substrate carrier from the conveyor. Both aspects may likewise be employed to load and/or unload an individual substrate (without a carrier) from a moving conveyor.

Further inventive aspects include the specific mechanisms employed for transferring a substrate or substrate carrier to and from a conveyor while the substrate or substrate carrier is moving along the conveyor.

Other features and aspects of the present invention will become more fully apparent from the following detailed description of the preferred embodiments, the appended claims and the accompanying drawings.

DETAILED DESCRIPTION

In accordance with the invention, substrate carriers are transported by a substrate carrier transport system (e.g., a conveyor), that continues to move during individual substrate or substrate carrier unloading and loading operations. A load/unload mechanism may be associated with a fabrication tool or group of fabrication tools and operates to load and/or unload substrates or substrate carriers from or onto the transport system while the transport system is moving. Each load/unload mechanism includes a load/unload member that is moved during a load or unload operation so as to substantially match the velocity at which the transport system carries the substrate or substrate carrier while the load/unload member disengages or engages a substrate or substrate carrier from, or to, the moving transport system. The load and/or unload member is thus adapted to ensure gentle substrate/substrate carrier handling. Further, the load and/or unload member may be adapted for precise and repeatable substrate/substrate carrier placement.

Figure 1:
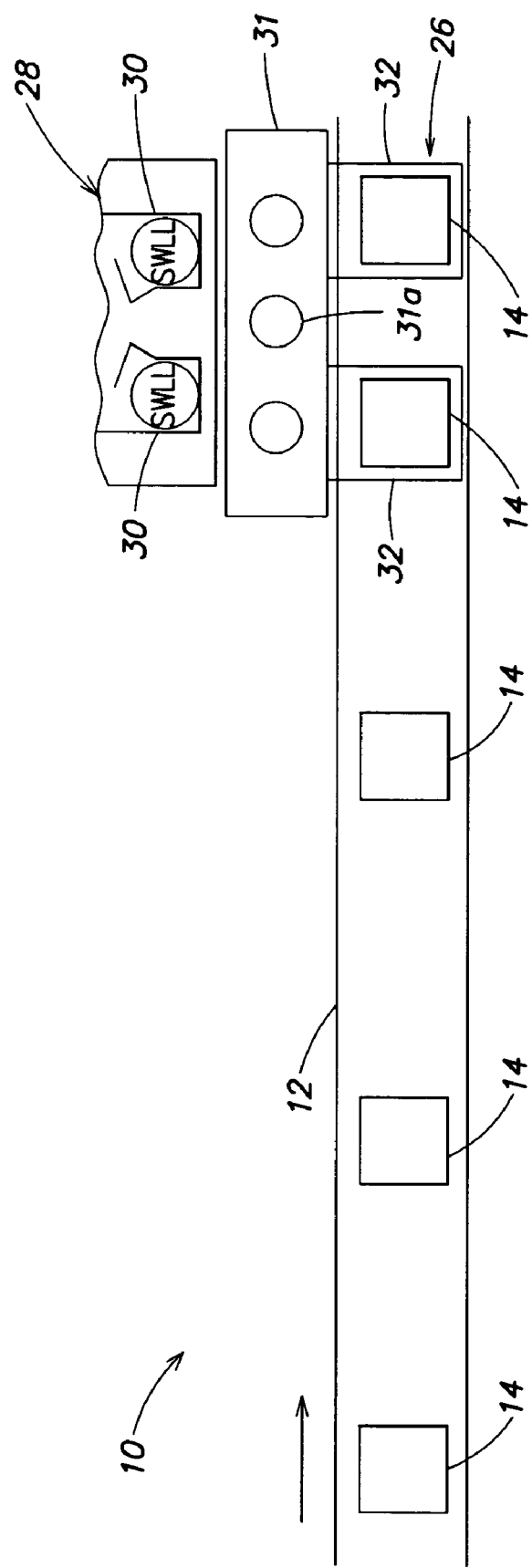
FIG. 1 is a schematic top plan view of a portion of a substrate carrier transport system provided in accordance with the invention.

FIG. 1 is a top plan view which shows a portion of a substrate carrier transport system provided in accordance with one aspect of the invention. Reference numeral 10 generally indicates the substrate carrier transport system. The substrate carrier transport system 10 may include an overhead transport system or conveyor 12 which conveys substrate carriers 14. Only a portion of the path of the conveyor 12 is shown in FIG. 1. It should be understood that the conveyor 12 may advantageously follow an extensive and perhaps serpentine path that extends past every processing location in a fabrication facility.

The substrate carriers 14 may be any type of substrate carrier, including a sealed pod, an open cassette, or any apparatus with which one or more substrates may be held while the substrate(s) are transported. In one embodiment of the invention, each substrate carrier 14 is a single substrate carrier, i.e. a substrate carrier which holds one and only one substrate at a time. The substrate carriers 14 may generally be constructed like one or another of the substrate carriers disclosed in co-pending and commonly assigned patent application Ser. No. 09/755,394, filed Jan. 5, 2001, or commonly assigned patent application Ser. No. 60/407,340 filed Aug. 31, 2002, for example, both of which are incorporated herein in their entirety by this reference.

Figure 3A:
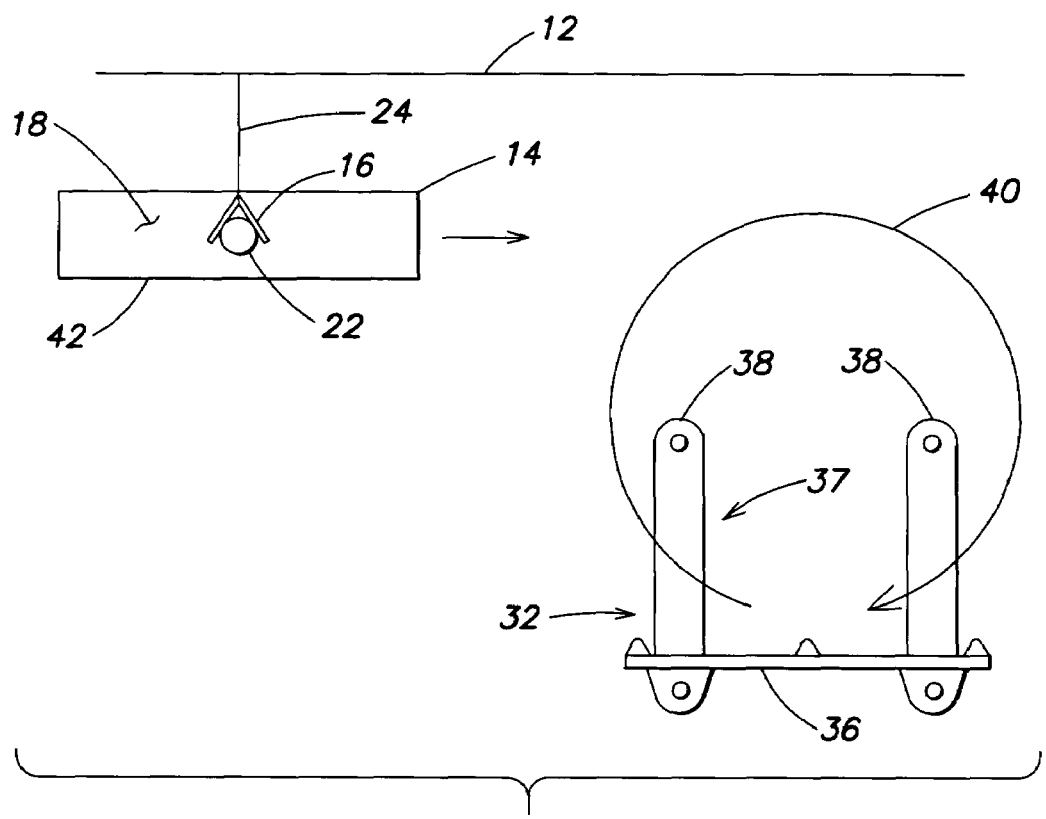
FIGS. 3(a) and 3(b) are side views that schematically illustrate an operation for unloading a substrate carrier from a conveyor that is part of the substrate carrier transport system of FIG. 1.

For example, as schematically illustrated in FIGS. 3(a) and (b), each substrate carrier 14 may have handles 16 (of which only one is shown in the drawings) mounted on sides 18 (only one shown) of the substrate carriers 14 and including a downwardly-facing V-shaped notch 20. The V-shaped notch 20 is adapted to be engaged by a bar-shaped end effector 22 which is part of the conveyor system and is connected to the conveyor 12 by a suspension assembly 24. It will be appreciated that each suspension assembly 24 includes two end effectors 22, of which only one is shown in the drawings. The two end effectors each respectively engage one of the handles 16 of the substrate carrier 14. Thus the conveyor 12 is able to transport the substrate carrier 14 with the substrate carrier 14 suspended from the conveyor 12 via the suspension assembly 24 and the handles 16.

As will be appreciated from the above-referenced '394 patent application, the substrate carriers 14 may alternatively be equipped with bar-shaped handles that project outwardly from the sides 18 of the substrate carrier 14, and the conveyor system may have end effectors formed with upward-facing notches to engage the bar-shaped handles of the substrate carriers according to this alternative design, which is not shown in the drawings.

Although not shown in the drawings, the suspension assemblies 24 of the conveyor 12 may also include a restraint device that extends downwardly to minimize rocking of the substrate carrier 14 while the substrate carrier is suspended from and transported by the conveyor 12. Such a restraint device is disclosed in the above-referenced '394 patent application. Other substrate carrier designs may be employed. For instance, a substrate carrier having an overhead transfer flange or other mechanism for suspending the substrate carrier may be employed.

Referring again to FIG. 1, the conveyor 12 passes by a substrate loading station 26. The substrate loading station 26 is positioned in front of a fabrication tool 28, of which only a portion is shown in the drawing. Specifically, the drawing shows only load locks 30 of the fabrication tool 28. It will be understood that fabrication tool 28 is merely exemplary. Other fabrication tools may not include load locks or may include a greater or lesser number of load locks. As shown in FIG. 1, the processing tool also includes what is known as a factory interface chamber 31. Conventionally factory interface chambers contain one or more substrate handlers that extract one or more substrates from a substrate carrier or substrate support and transport the substrates (individually or in a group) into the processing tool (e.g., into a load lock or a processing chamber). It should be noted that not all fabrication tools employ/include a factory interface chamber.

In a preferred embodiment of the invention, the substrate loading station 26 and fabrication tool 28 represent only one of numerous substrate processing locations in a fabrication facility served by the conveyor 12.

Mounted adjacent (near or preferably within the footprint of) the substrate loading station 26 are load/unload mechanisms which are described in more detail below. Each load/unload mechanism may be adapted to load and/or unload a substrate carrier 14 to or from the conveyor 12 while the conveyor 12 is moving.

The substrate loading station 26 may include one or more load ports or similar locations where individual substrates or substrate carriers are placed for substrate transfer to and/or from a processing tool (e.g., one or more docking stations although transfer locations that do not employ docking/undocking movement may be employed). The load ports may optionally include an automatic door opener for opening a door of a sealed substrate carrier. The substrate loading station 26 may also include one or more storage locations for storing substrate carriers. In one aspect the substrate loading station 26 includes a substrate handler comprising a horizontal and a vertical linear guide to which an end effector for supporting an individual substrate or a substrate carrier, is coupled as shown and described with reference to FIG. 7A. Preferably the substrate loading station 26 includes a plurality of vertically stacked docking stations and/or storage locations.

The substrate loading station preferably is adapted such that substrate carriers are transferred between the conveyor 12 and the substrate loading station, and among the plurality of vertically stacked docking stations and/or storage locations so as to remain within a tool envelope defined by the footprint of the plurality of vertically stacked docking stations and/or storage locations, and a vertical transfer channel adjacent thereto. In a further aspect, the substrate storage location may include a pair of vertically stacked docking stations and/or storage locations having a transfer channel therebetween, and is adapted such that the substrate carriers are transferred between the conveyor 12 and the substrate loading station, and among the plurality of vertical stacks so as to remain within a tool envelope defined by the pair of vertical stacks, and the transfer channel therebetween.

As will be understood, the mechanism for loading/unloading a substrate or substrate carrier from the conveyor may vary considerably and still achieve the function of substantially matching the velocity of the conveyor 12 at the point where the substrate carrier is contacted. Although it is preferred that a load/unload mechanism operates within the footprint of the docking station(s) and/or storage location(s) (or within the tool envelope), any mechanism that substantially matches velocity with a moving conveyor so as to load/unload substrate carriers therefrom will fall within the scope of the present invention. The load/unload mechanisms described herein are merely exemplary. For instance, in one aspect, a load/unload mechanism may be a rotary mechanism (e.g., a rotating platform or arm that travels along a rotary path as described further with reference to FIGS. 1–6 or as described in commonly assigned, copending application Ser. No. 10/650,481 filed Aug. 28, 2003, titled "Method And Apparatus For Unloading Substrate Carriers From Substrate Carrier Transport System", which is hereby incorporated by reference herein in its entirety. In a further aspect the load/unload mechanism may comprise a substrate handler of the substrate loading apparatus 26, as described further with reference to FIGS. 7A–13D.

Figure 2:
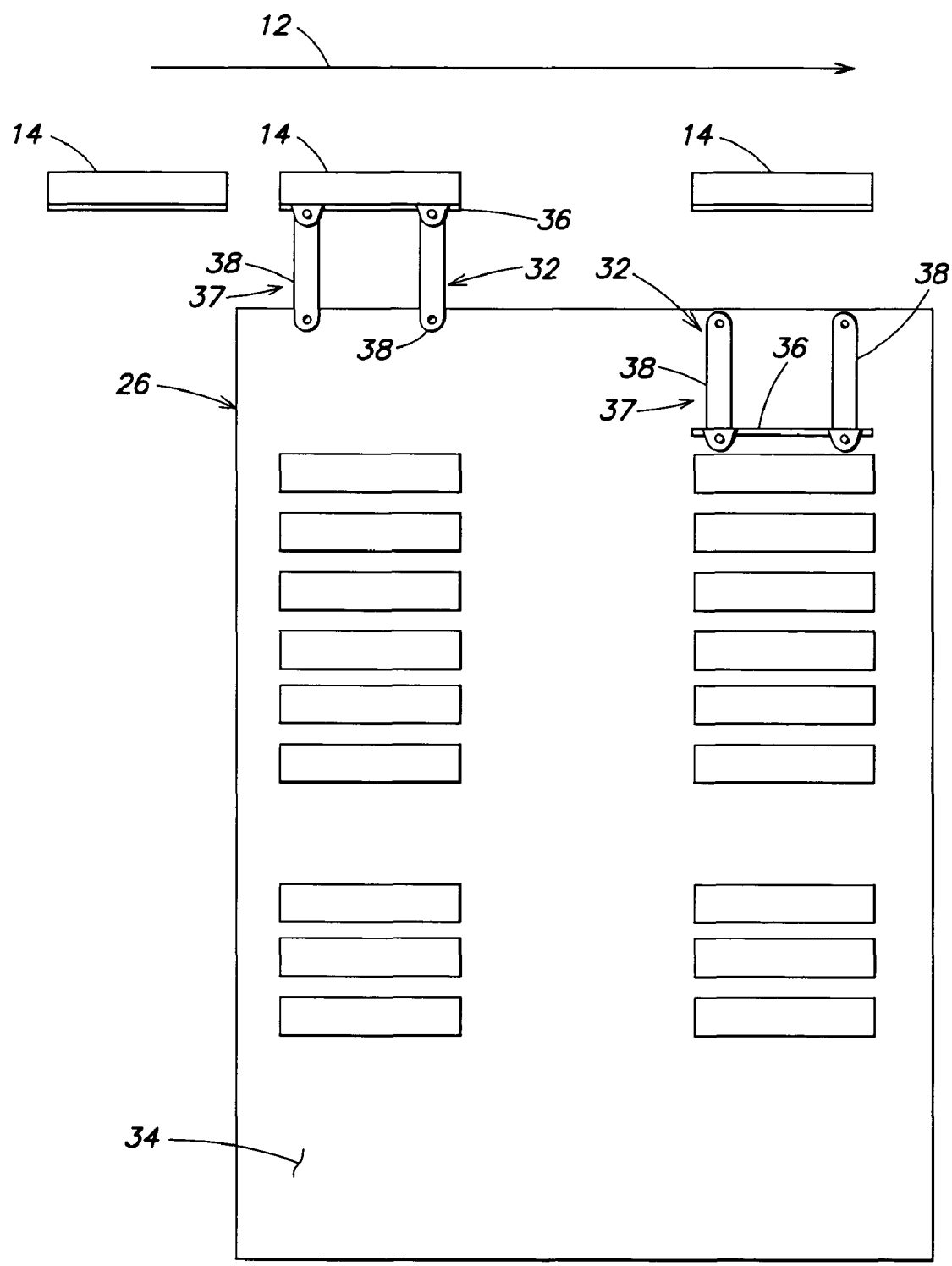
FIG. 2 is a schematic side view showing load/unload mechanisms that are part of the substrate transport system of FIG. 1.

FIG. 2 is a schematic side view of the conveyor 12 at the location where it passes an exemplary substrate loading station 26 having a rotary load/unload mechanism. The front 34 of the substrate loading station 26 is schematically shown in FIG. 2. As seen in FIGS. 2 and 3(*a*), in this aspect each load/unload mechanism 32 includes a load/unload member 36 mounted on a four bar mechanism 37 of which two bars 38 are shown in the drawings. (To simplify the drawing, the conveyor 12 is represented schematically by an arrow 12 in FIG. 2, and the suspension assemblies 24 (FIG. 3(*a*) are omitted.) The four bar mechanism 37 allows the load/unload member 36 to be moved in a circular path indicated at 40 in FIG. 3(*a*). It will be appreciated that the circular path 40 is defined in a vertical plane.

Also shown in FIG. 2 are a plurality of substrate or substrate carrier storage shelves and a plurality of docking stations. Although not shown in FIG. 2, the loading station 26 may also comprise a substrate or substrate carrier handler. In a preferred aspect, the substrate/substrate carrier handler may be similar to that shown in FIG. 7A, wherein the substrate/substrate carrier handler comprises vertical and horizontal linear guides and an end effector adapted to move linearly therealong via the vertical and horizontal guides.

FIG. 3(*a*) is a schematic side view of the conveyor 12, showing a substrate carrier 14 engaged by a suspension assembly 24 of the conveyor 12 approaching the load/unload mechanism 32. FIG. 3(*a*) shows the load/unload mechanism in its home position. The load/unload mechanism 32 operates so that the load/unload member 36 is moved upwardly and then, continuing through the circular path 40, is moved so that it has a horizontal speed component that substantially matches the horizontal speed of the substrate carrier 14 (and the conveyor 12) at a point where the load/unload member 36 contacts the substrate carrier 14 (in this example the bottom surface 42 of the substrate carrier 14) to lift the substrate carrier 14 out of engagement with the suspension assembly 24 of the conveyor 12. Thus the movement of the substrate carrier 14 relative to the load/unload member 36, at the time of engagement of the substrate carrier 14 by the load/unload member 36, is substantially entirely in a vertical direction. Loading of the substrate carrier 14 on the conveyor 12 is thereby accomplished substantially without jarring the substrate carrier 14.

The load/unload mechanism 32 may include a motor, which is not shown, to drive the four bar mechanism 37. The motor may be controlled by a controller C programmed to cause the four bar mechanism 37, and consequently the load/unload member 36 to be driven at a rotational rate that varies over the course of movement of the load/unload member 36 through the circular path 40. In one alternative, a cam arrangement (not shown) may drive the four bar mechanism 37 and the load/unload member 36 at a variable rotational rate. It is alternatively contemplated that the load/unload mechanism may be driven by a drive mechanism coupled to, and driven from, the conveyor 12.

The load/unload member 36 may be in the form of a plate that may include a shock absorbing material. However, to save weight in the construction of the load/unload member, it may be in the form of a lifting frame and/or may have pins on air solenoids for contacting the bottom surface 42 of the substrate carrier 14.

Figure 3B:
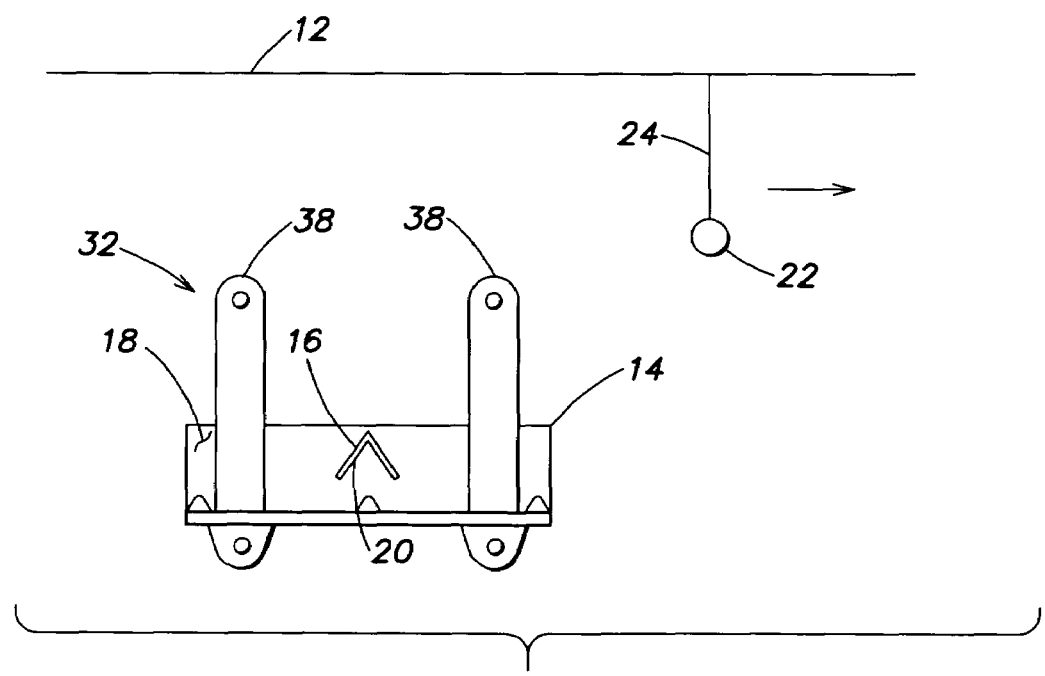

FIG. 3(b) is a view similar to FIG. 3(a) showing the load/unload mechanism 32 again in its home position and holding the substrate carrier 14 which was formerly engaged by the suspension assembly 24 of the conveyor 12 and has been lifted off the suspension assembly 24 by the load/unload mechanism 32. FIG. 3(b) also shows the suspension assembly 24 continuing to move and moving away from the load/unload mechanism 32.

FIGS. 4(a)–(f) are a sequence of drawings which illustrate in more detail an operation in which the load/unload mechanism 32 unloads a substrate carrier 14 from the conveyor 12. (To simplify the drawings, the conveyor 12 is not shown in FIGS. 4(a)–(f).)

Figure 4C:
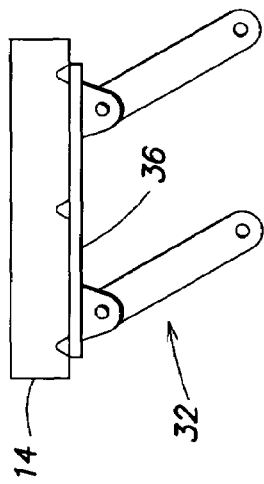
FIGS. 4(a)–(f) are a sequence of schematic side views that illustrate a substrate carrier unload operation performed by one of the load/unload mechanisms of FIG. 2.
Figure 4B:
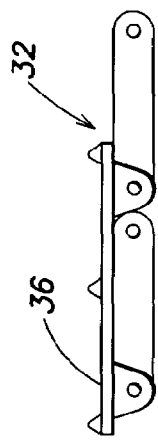
Figure 4A:
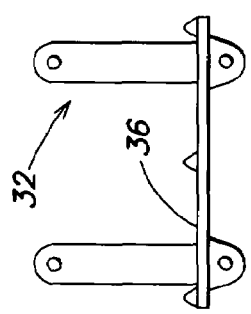

FIG. 4(a) shows the load/unload mechanism 32 in its home position at which it may await approach of a substrate carrier 14 that is to be unloaded from the conveyor 12 by the load/unload mechanism 32. As the substrate carrier 14 approaches, the load/unload mechanism 32, in the example shown, is moved from the home position of FIG. 4(a) to the position shown in FIG. 4(b), which is midway between the home position and the apex of the circular path 40 of the load/unload mechanism 32.

FIG. 4(c) shows the load/unload mechanism 32 at a point in its cycle at which it contacts the substrate carrier 14 from below to lift and disengage the substrate carrier 14 from the conveyor 12. At the point in time represented by FIG. 4(c), the load/unload member 36 is moved at a rotational rate that results in a horizontal displacement of the load/unload member 36 at a velocity that substantially matches the velocity of the substrate carrier 14 (i.e., substantially matches the velocity of the conveyor 12). Consequently, there may be substantially no relative horizontal movement between the load/unload member 36 and the substrate carrier 14 at the point in time represented by FIG. 4(c). Thus the load/unload member 36 may lift the substrate carrier 14 out of engagement with the conveyor 12 without jarring the substrate carrier 14. In one embodiment of the invention, the load/unload member 36 imparts an upward acceleration to the substrate carrier 14 of about 1G or less so as to avoid generating particles and/or damaging the substrate (not separately shown) that is contained within the substrate carrier 14.

Figure 4F:
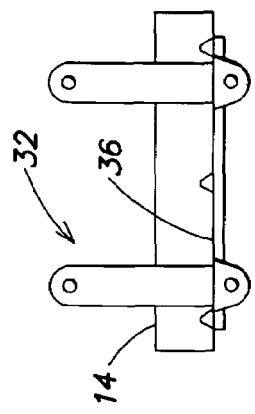
Figure 4E:
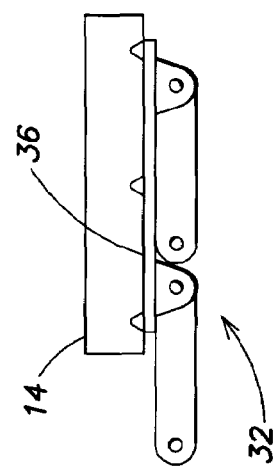
Figure 4D:
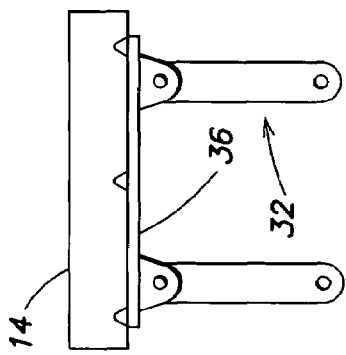

At the next stage of the unload operation, represented by FIG. 4(d), the load/unload mechanism 32 is at the apex of its cycle, having lifted the substrate carrier 14 out of engagement with the conveyor 12. In one embodiment of the invention, the vertical distance between the positions shown in FIGS. 4(c) and (d) may be on the order of one-half inch. The substrate carrier 14 may be supported on the load/unload member 36 by the bottom surface 42 of the substrate carrier 14, for example, and is now decelerated in a horizontal direction, to allow the end effectors 22 (FIG. 3(a)) of the suspension assembly 24 (FIG. 3(a)) of the conveyor 12 to move ahead of the substrate carrier 14.

FIG. 4(e) represents the next stage of the unload cycle, at which the load/unload mechanism 32, with the substrate carrier 14 supported thereon, is at a mid point between its apex and its home position. Then, FIG. 4(f) shows the load/unload mechanism back at its home position, and supporting the unloaded substrate carrier 14.

FIGS. 5(a)–(f) are a sequence of views like FIGS. 4(a)–(f), but illustrating an operation for loading a substrate carrier 14 on the conveyor 12. As in FIGS. 4(a)–(f), the conveyor 12 is not shown in FIGS. 5(a)–(f) to simplify the drawings.

Figure 5A:
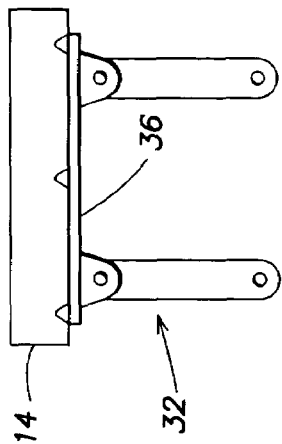
FIGS. 5(a)–(f) are a sequence of schematic side views that illustrate a substrate carrier load operation performed by one of the load/unload mechanisms of FIG. 2.
Figure 5B:
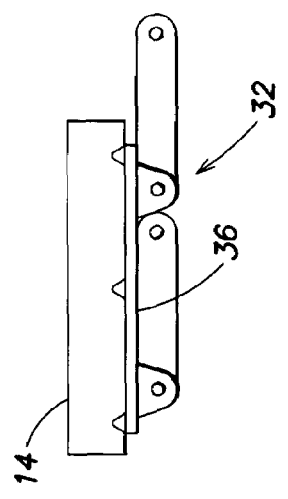
Figure 5C:
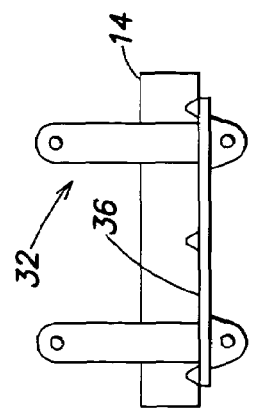
Figure 5D:
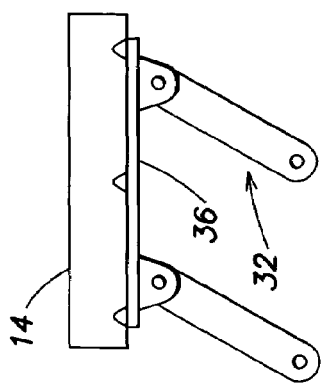

FIG. 5(a) shows the load/unload mechanism 32 in its home position, supporting a substrate carrier 14 that is to be loaded onto the conveyor 12. As an empty suspension assembly 24 of the conveyor 12 approaches, the load/unload mechanism 32 is moved to the position shown in FIG. 5(b), i.e., midway between the home position and the apex, and continues to be moved up to its apex, as indicated at FIG. 5(c). The load/unload mechanism 32 continues to be moved along its circular path 40 (FIG. 3(a)) to and through the point in its cycle illustrated in FIG. 5(d). FIG. 5(d) illustrates the position at which the load/unload mechanism 32 lowers the substrate carrier 14 into engagement with the end effectors 22 of the conveyor 12. At the position illustrated in FIG. 5(d) the load/unload mechanism 32 is being rotated at a rotational velocity that results in a horizontal speed component that matches the velocity (e.g., horizontal speed) of the conveyor 12. Thus the movement of the substrate carrier 14 relative to the end effectors 22 of the conveyor 12 at the time of engagement of the substrate carrier 14 by the end effectors 22 is substantially entirely in a vertical direction, thereby accomplishing loading of the substrate carrier 14 on the conveyor 12 substantially without jarring the substrate carrier 14.

Figure 5E:
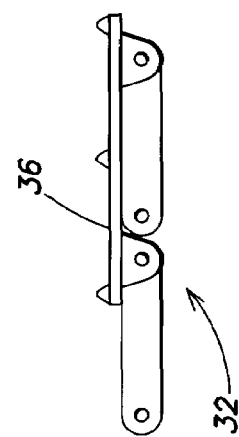
Figure 5F:
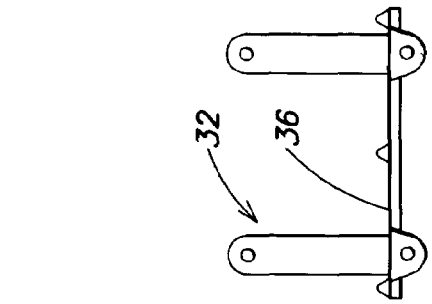

FIG. 5(e) shows the load/unload mechanism 32 at a midpoint between its apex and its home position, and no longer supporting the substrate carrier 14, which has been loaded onto the conveyor 12. FIG. 5(f) shows the load/unload mechanism 32 back at its home position, without the substrate carrier 14.

As in the apparatus disclosed in the above-referenced '394 patent application, sensors (not shown) may be employed to track the positions of substrate carriers 14. As will be understood from the disclosure of the '394 patent application, one such sensor may be a through beam sensor including a light beam transmitter and a light beam receiver disposed on opposite sides of a path through which the conveyor 12 transports the substrate carriers 14. The through beam sensors may be used to track passage of leading and trailing edges of the substrate carriers 14. If it is desired to track a center of the substrate carriers 14, a reflector (not shown) may be placed on a surface (e.g., the bottom surface 42) of the substrate carriers 14 and sensors having both transmitter and receiver on the same side of the substrate carrier transport path may be provided. The signals from the sensor receivers may be provided to a controller (not shown) for the substrate carrier transport system 10.

It will be appreciated that the substrate carrier 14 may be transported with its front side facing the direction in which it is being transported. "Front side" meaning the side of the substrate carrier 14 which has an opening (not shown) through which a substrate or substrates may be extracted from the substrate carrier 14. If the substrate carrier 14 is transported by the conveyor 12 with the front side of the substrate carrier 14 facing the direction in which it is transported, then it may be necessary to rotate the substrate carrier 14 (90° counter clockwise in the view shown in FIG. 1) so that the front side of the substrate carrier 14 is presented toward a load lock 30 of the fabrication tool 28. For the purpose of so rotating the substrate carrier 14, the load/unload mechanism 32 may be mounted on a rotatable platform (not shown) of the type discussed in the above-referenced '394 patent application.

Figure 6:
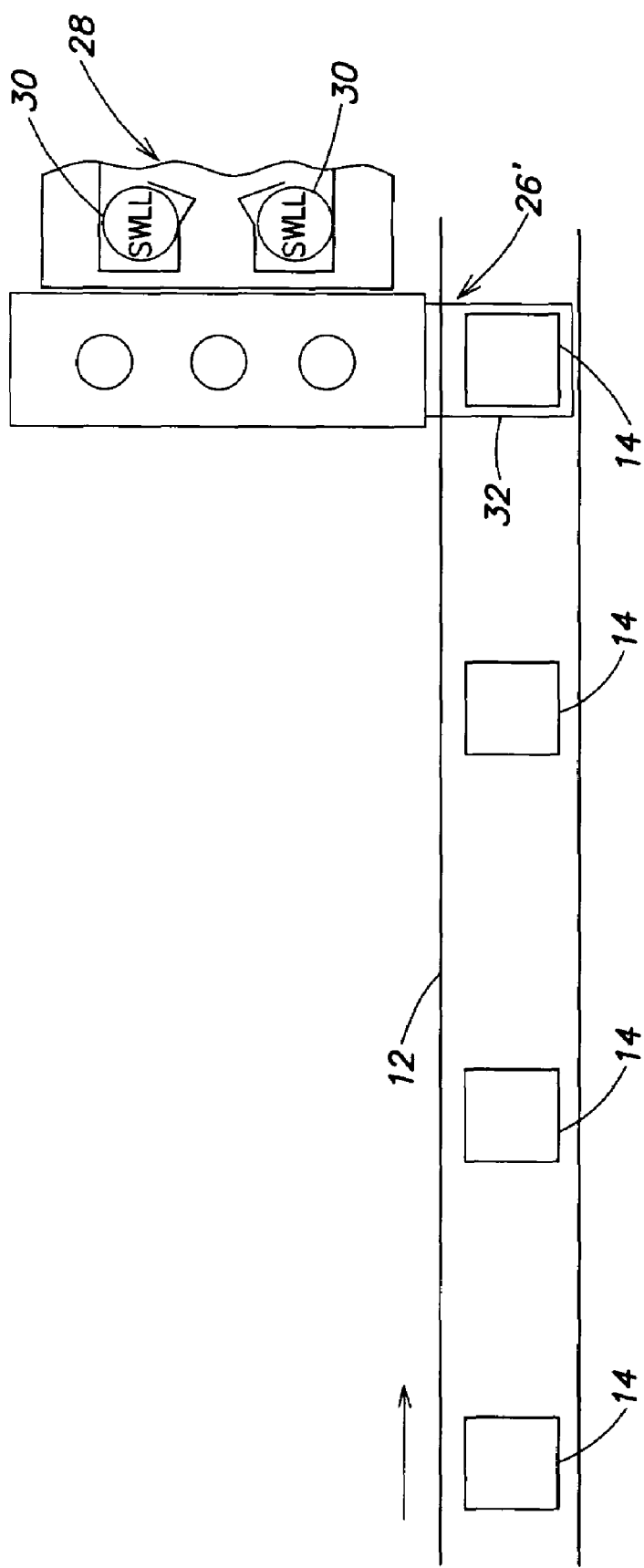
FIG. 6 is a schematic top plan view, similar to FIG. 1, of an alternative embodiment of the inventive substrate carrier transport system.

As an alternative to rotating the substrate carrier 14 in this manner, an embodiment of the invention as shown in FIG. 6 may be provided. FIG. 6 is a top plan view similar to FIG. 1, but showing a substrate loading station 26' installed so that it extends perpendicular to the path of travel of the conveyor 12. If load/unload mechanism like those of FIG. 2 are employed, the four bars will be rotated 90° from the orientation shown in FIG. 2, so as to be able to rotate in the direction the conveyor 12 travels.

It will be noted that in the embodiment of FIG. 6 the fabrication tool 28 is installed with its load locks 30 facing the direction from which substrate carriers 14 are transported by the conveyor 12. Consequently, assuming that the substrate carriers 14 are transported with their front sides facing in the direction of transport, there is no need in the embodiment of FIG. 6 to rotate the substrate carriers 14 to permit extraction of a substrate or substrates therefrom at or in front of the load locks 30.

Although only one fabrication tool 28 is shown in FIG. 6, it is further contemplated, pursuant to the teachings of co-pending and commonly assigned U.S. patent application Ser. No. 09/517,227, filed Mar. 2, 2000, to have the substrate loading station 26' extend farther from the conveyor 12 to accommodate one or more additional fabrication tools 28 installed parallel to the fabrication tool 28 shown in FIG. 6 and farther away from the conveyor 12. The '227 patent application is incorporated herein in its entirety by this reference.

Figure 7A:
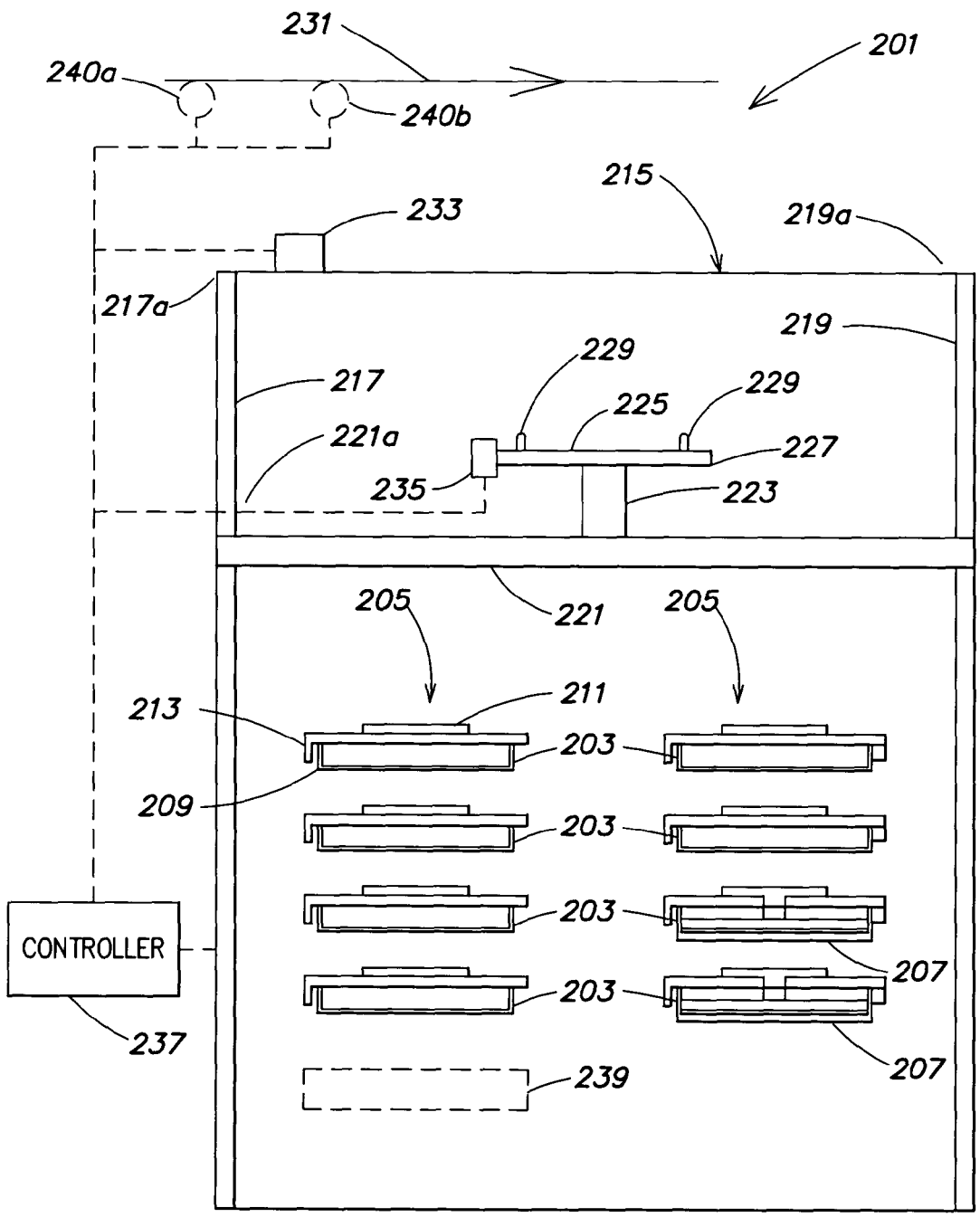
FIG. 7A is a front elevational view of a substrate loading station provided in accordance with the present invention.

In operation, the conveyor 12 may continuously transports substrate carriers 14 from location to location within the fabrication facility. A substrate carrier 14 is unloaded by a load/unload mechanism 32 at a substrate loading station 26 or 26' from the conveyor 12 while the conveyor and the substrate carrier are moving. The substrate carrier 14 is rotated or otherwise reoriented, if necessary, so that its opening faces the fabrication tool 28, and a substrate carrier handler (e.g., as shown in FIG. 7A) associated with the substrate loading apparatus removes the substrate carrier 14 from the load/unload mechanism 32. The substrate carrier handling robot either places the substrate carrier 14 at a docking station (as further described with reference to FIG. 7A) for the fabrication tool 28, or places the substrate carrier 14 on a storage shelf of the substrate loading station 26 to await subsequent transfer by the substrate carrier handler (e.g., as shown in FIG. 7A) to a docking station of the fabrication tool. In one aspect, the substrate loading station 26 may comprise an apparatus having one or more vertically stacked storage shelves such as an Applied Materials' Bay Distributed Stocker, as disclosed in U.S. Pat. No. 6,283,692. Alternative substrate loading stations are described with reference to FIGS. 7A–13D.

Once at the load port, the substrate carrier may be opened and interfaced to the fabrication tool 28 in a conventional manner. In an aspect which does not employ the factory interface chamber 31 of FIG. 1, a substrate or substrates may be extracted from the substrate carrier and brought into the fabrication tool 28 via a load lock 30 which after receiving one or more substrates at atmospheric pressure closes and pumps to a vacuum pressure. The substrate or substrates are then extracted and transferred to one or more processing chambers (not shown) of the fabrication tool for processing as is known in the art. After processing, the substrate or substrates are returned to the load lock which then vents to atmospheric pressure. Thereafter the substrate or substrates are loaded back into the substrate carrier 14 and the substrate carrier is closed. The substrate carrier handling robot transfers the substrate carrier to a load/unload mechanism 32, possibly after the substrate carrier has been stored on a storage shelf of the substrate loading station 26.

As previously described, the load/unload mechanism loads the substrate carrier onto an empty suspension assembly 24 of the conveyor 12 while the conveyor is moving. The conveyor 12 transports the substrate carrier away from the substrate loading apparatus and to another processing location, at which the substrate carrier is again unloaded without stopping the conveyor.

An alternative embodiment of the substrate loading station which employs a substrate handler of the substrate loading station as a load/unload mechanism will now be described with reference to FIGS. 7A–13E. Note that the rotary load/unload mechanism of FIGS. 2–6 may be employed within the substrate loading station of FIG. 7A, in addition to use of the substrate handler for load and/or unload operations, or alternatively thereto. Load/unload mechanisms 32 are therefore shown in phantom in FIG. 7A.

FIG. 7A is a front elevational view of a substrate loading station 201 provided in accordance with the invention. Although not shown in FIG. 7A, it should be understood that the inventive substrate loading station 201 may be associated with a processing tool and/or factory interface of the kind described in connection with FIG. 1.

The substrate loading station 201 may include one or more load ports or similar locations where substrates or substrate carriers are placed for transfer to and/or from a processing tool (e.g., one or more docking stations 203, although transfer locations that do not employ docking/undocking movement may be employed). In the particular embodiment shown in FIG. 7A, the substrate loading station 201 includes a total of eight docking stations 203, arranged in two columns 205 of four docking stations each. Other numbers of columns and/or docking stations may be employed. Each docking station 203 is adapted to support and/or dock a substrate carrier 207 at the docking station 203 and to allow a substrate (not shown) to be extracted from the substrate carrier 207 at the docking station 203 and transferred to a processing tool such as the processing tool 113 of FIG. 1 (e.g., by a factory interface robot, such as the factory interface robot 31*a* of FIG. 1). In one embodiment of the invention, the substrate carriers 207 are single substrate carriers. "Single substrate carrier" will be understood to mean a substrate carrier shaped and sized to contain only one substrate at a time. Substrate carriers that hold more than one substrate also may be employed (e.g., 25 or any other number). (Alternatively, one or more docking stations 203 may be adapted to directly support a substrate without a substrate carrier). Each docking station 203 may be configured, for example, as described in previously incorporated U.S. patent application Ser. No. 60/407,337, filed Aug. 31, 2002 and titled "Wafer Loading Station with Docking Grippers at Docking Stations". Other docking station configurations may be employed.

Each docking station 203 may include a port 209 through which a substrate may be transferred to the factory interface (e.g., factory interface 31*a* in FIG. 1). Adjacent each port 209 is a docking gripper 211 which is adapted to suspend a substrate carrier 207 and to move the suspended substrate carrier between a docked and undocked position. A moveable stage or other support (not shown) alternatively may be employed to support (e.g., from below or otherwise) and/or dock/undock each substrate carrier 207 at each docking station 203. Each port 209 may also include a substrate carrier opener 213 which, in one aspect, is adapted to employ docking movement of a substrate carrier 207 to open the substrate carrier 207 as it moves from an undocked position to a docked position as described in previously incorporated, U.S. patent application Ser. No. 60/407,339, filed Aug. 31, 2002, entitled "METHOD AND APPARATUS FOR USING WAFER CARRIER MOVEMENT TO ACTUATE WAFER CARRIER DOOR OPENING/CLOSING". Each substrate carrier 207 may have, for example, the carrier door latching and/or substrate clamping features disclosed in previously incorporated, U.S. patent application Ser. No. 60/407,340, filed Aug. 31, 2002, entitled "WAFER CARRIER HAVING DOOR LATCHING AND WAFER CLAMPING MECHANISMS". Other substrate carrier opener, door latching, and/or substrate clamping configurations may be employed.

The substrate loading station 201 also includes a substrate carrier handler 215 which operates in accordance with an aspect of the invention. In one or more embodiments of the invention, the substrate carrier handler 215 includes a pair of vertical guides 217, 219 and a horizontal guide 221 which is mounted for vertical movement on the vertical guides 217, 219. A belt drive or a lead screw and an associated motor or motors (which are not shown) or other suitable mechanism is provided to drive the horizontal guide 221 for vertical movement along the vertical guides 217, 219. A support 223 is mounted on the horizontal guide 221 for horizontal movement along the horizontal guide 221. A belt drive or lead screw, and associated motor or motors (which are not shown) or other suitable mechanism is provided to move the support 223 horizontally along the horizontal guide 221.

In at least one embodiment of the invention, the vertical guides 217, 219 may each comprise an integrated guide/driving mechanism such as Part No. 1140-260-10, 1768 mm available from Bosch, Inc. Likewise, the horizontal guide 221 may comprise an integrated guide/driving mechanism such as Part No. 1140-260-10, 1468 mm also available from Bosch, Inc. Other guide/driving mechanism systems may be employed.

An end effector 225 is mounted on the support 223. The end effector 225 may be, for example, in the form of a horizontally-oriented platform 227 adapted to support a substrate carrier (e.g., one of the substrate carriers 207). In at least one embodiment, the platform 227 may have kinematic pins or other kinematic positioning features 229. (Although only two kinematic features 229 are shown in FIG. 7A, other numbers of kinematic pins or features such as three or more may be provided on the platform 227.) The kinematic features 229 may cooperate with concave or otherwise shaped features (not shown in FIG. 7A) on the bottom of the substrate carrier 207 to guide the substrate carrier 207 into correct (positive) positioning on the platform 227. In at least one embodiment of the invention, the end effector 225 may comprise, for example, an end effector capable of changing the orientation of a substrate carrier from vertical to horizontal and vice versa as described in previously incorporated, U.S. patent application Ser. No. 60/407,452, filed Aug. 31, 2002 and titled "End Effector Having Mechanism For Reorienting A Wafer Carrier Between Vertical And Horizontal Orientations". Any other suitable end effector also may be employed.

A continuously or otherwise moving conveyor, schematically represented by an arrow 231, is positioned above the substrate loading station 201 and the substrate carrier handler 215. The conveyor 231 is adapted to transport substrate carriers such as the substrate carriers 207 to and from the substrate loading station 201. In one embodiment of the invention, the continuously moving conveyor 231 may be implemented as a ribbon of stainless steel or similar material as described in previously incorporated U.S. patent application Ser. No. 60/443,087, filed Jan. 27, 2003. The present invention similarly may be employed with any other type of continuously or otherwise moving conveyor.

The substrate loading station 201 may include one or more sensors 233, 235 for detecting movement and/or positions of (1) the conveyor; (2) components of the conveyor 231 (e.g., components used to support substrate carriers being transported by the conveyor 231 as described further below with reference to FIGS. 9A–E, 11A–6E and 12C–7D); and/or (3) substrate carriers being transported by the conveyor 231. For example, the sensor 233 may be mounted on the substrate loading station 201, and the sensor 235 may be mounted on the end effector 225. Other sensor locations may be employed, as may any suitable sensors (e.g., through beam sensors, reflection-based sensors, etc.).

Figure 7B:
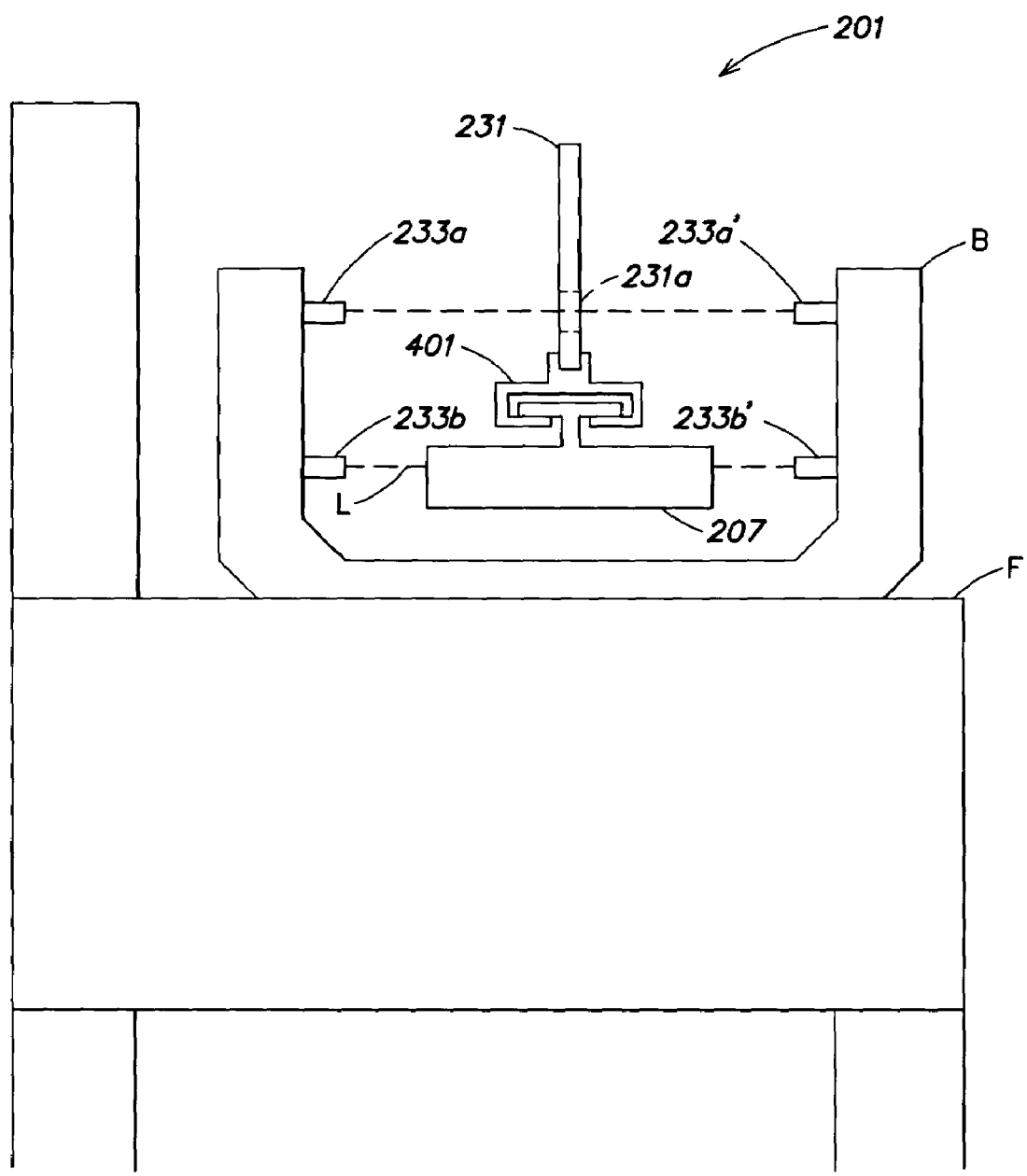
FIG. 7B is a side elevational view of a portion of the substrate loading station of FIG. 7A useful in describing an exemplary embodiment of a first sensor of the substrate loading station.

FIG. 7B is a side elevational view of a portion of the substrate loading station 201 useful in describing an exemplary embodiment of the sensor 233. With reference to FIG. 7B, the sensor 233 comprises a first sensor pair 233*a*, 233*a*' for detecting a speed and/or position of the conveyor 231; and/or position of the substrate carrier (and/or the speed with which a substrate carrier 207 is being transported by the conveyor 231 as described further below). The sensor 233 also may include a second sensor pair 233*b*, 233*b*' for detecting whether a substrate carrier 207 is being transported by the conveyor 231. For example, the first sensor pair 233*a*, 233*a*' may be mounted at an elevation of the conveyor 231 and the second sensor pair 233*b*, 233*b*' may be mounted at an elevation at which substrate carriers are transported by the conveyor 231 as shown in FIG. 2B (e.g., via a mounting bracket B coupled to a frame F of the substrate loading station 201, or via another suitable mounting mechanism). Each sensor pair may comprise, for example, a Model No. M126E2LDQ light source and a Model No. Q23SN6RMHSQDP receiver available from Banner, Inc. Other sensor arrangements/types may be employed. Exemplary embodiments for the sensor 235 are described further below with reference to FIGS. 7C–E and FIG. 8.

A controller 237 (FIG. 7A) may be coupled to the sensors 233, 235 and to the substrate carrier handler 215 to receive input from the sensors 233, 235 and to control operation of the substrate carrier handler 215 as described further below. More or fewer than the two sensors 233, 235 may be provided, and the sensors 233, 235 may be mounted at locations other than those shown in FIGS. 7A and 7B. The controller 237 may be the same controller used to control operation of a processing tool that the substrate loading station 201 serves, or a separate controller.

In at least one embodiment of the invention, speed of the conveyor (and/or a substrate carrier being transported by the conveyor) may be directly measured (rather than employing the sensor 233 to indirectly measure conveyor speed). For example, as shown in FIG. 7A, one or more encoders 240a, 240b (described below) may be coupled to the conveyor 231 and directly measure the speed of the conveyor 231 (and any substrate carriers being transported thereby) and provide speed information to the controller 237. More or fewer than two encoders may be employed. Each encoder may comprise, for example, a U.S. Digital encoder (e.g., an HDS6 quadrature encoder) or any other suitable encoder. A linear encoder, resolver or other positioning device also may be employed to measure conveyor speed and/or position.

Figure 8:
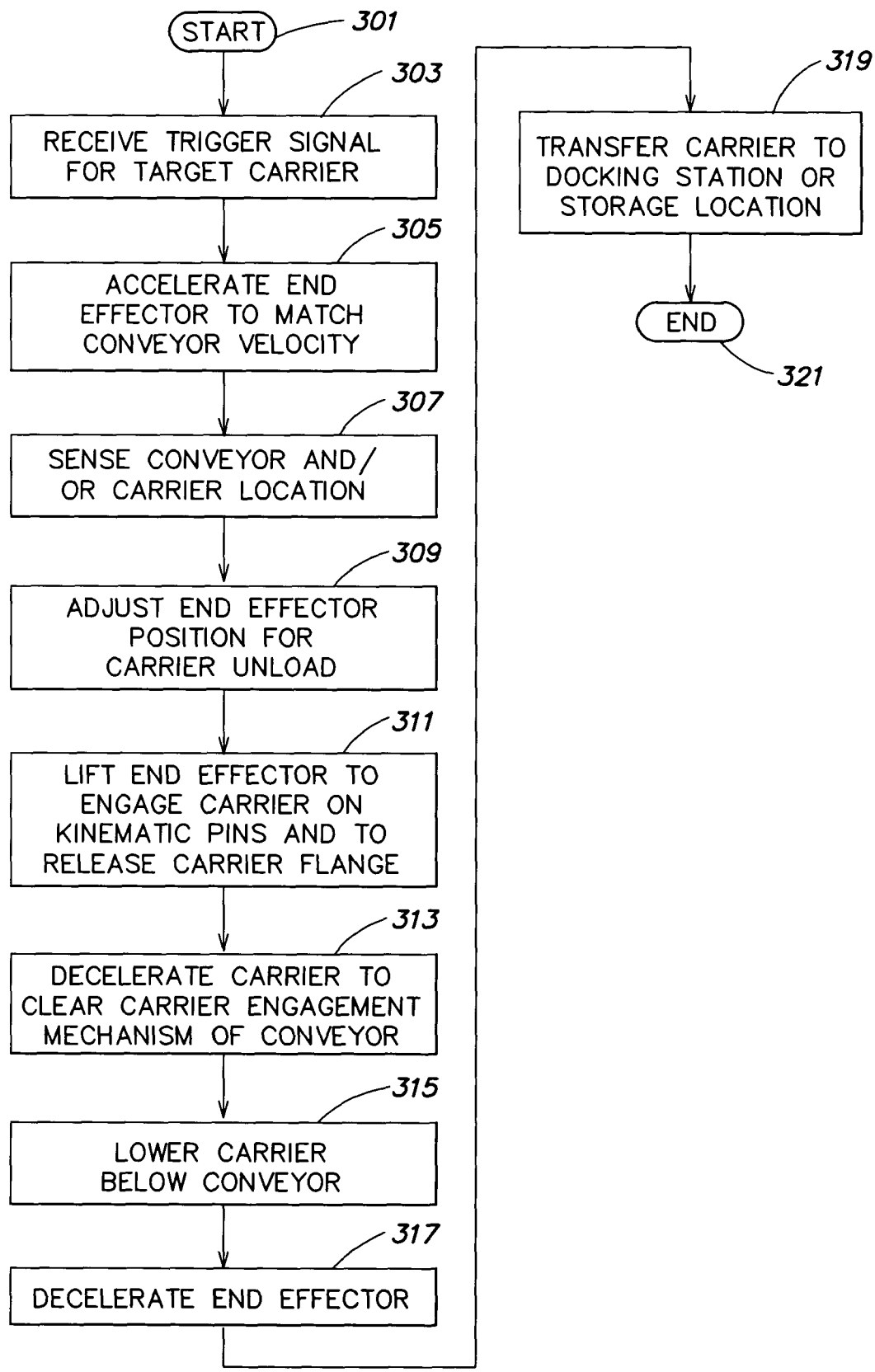
FIG. 8 is a flow chart that illustrates an exemplary process performed in accordance with the invention to unload a substrate carrier from a moving conveyor.

FIG. 8 is a flow chart that illustrates an exemplary process that may be performed by the substrate loading station 201 in accordance with the invention to unload a substrate carrier 207 from the conveyor 231. FIGS. 9A-9E are schematic side views, illustrating stages of the process of FIG. 8.

When an operation for unloading a substrate carrier 207 from the conveyor 231 is to be performed, the horizontal guide 221 of the substrate carrier handler 215 is positioned near the upper ends 217a, 219a of the vertical guides 217, 219, and the support 223 is positioned near the upstream side 221a (in the view of FIG. 7A, the left side although right to left travel may be employed if the conveyor 231 travels right to left) of the horizontal guide 221.

Figure 9A:
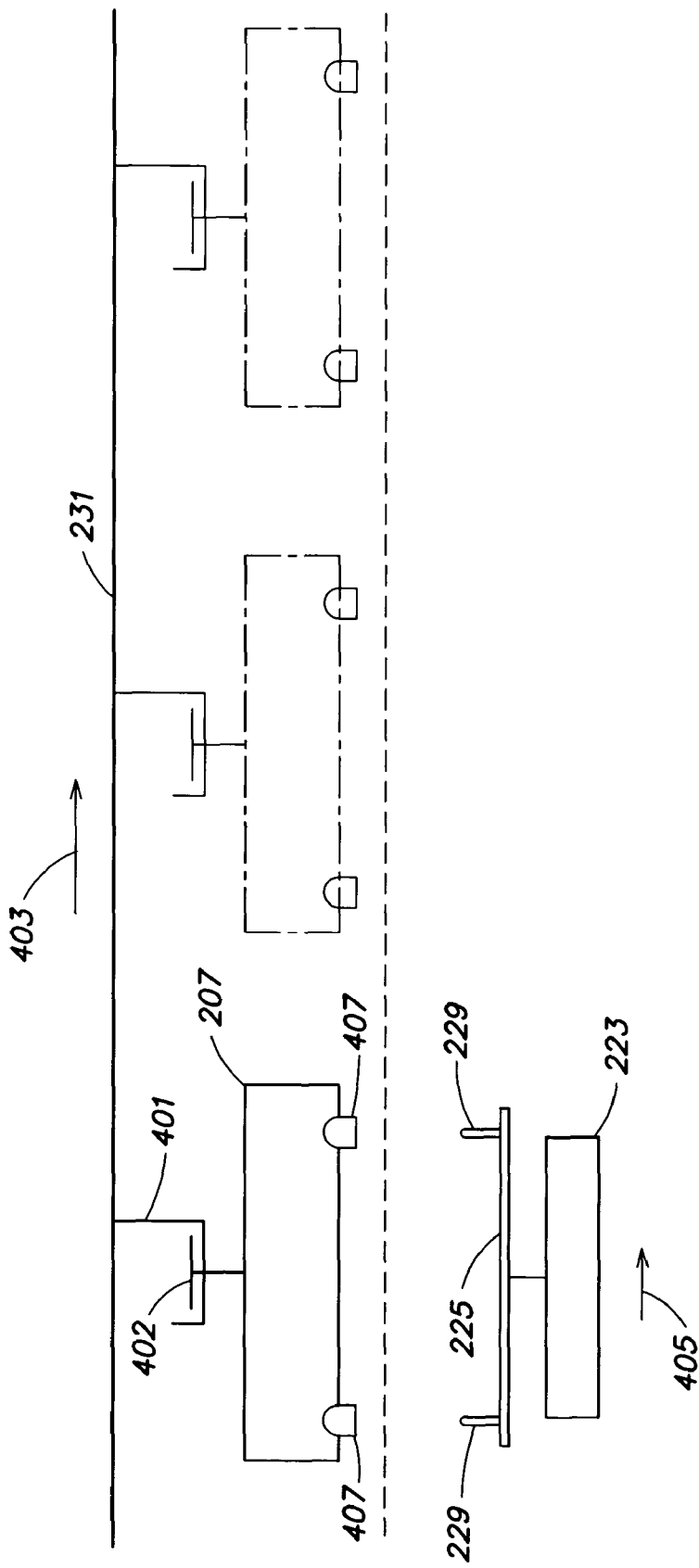
FIGS. 9A–9E are schematic side views showing various stages of the process of FIG. 8.
Figure 9B:
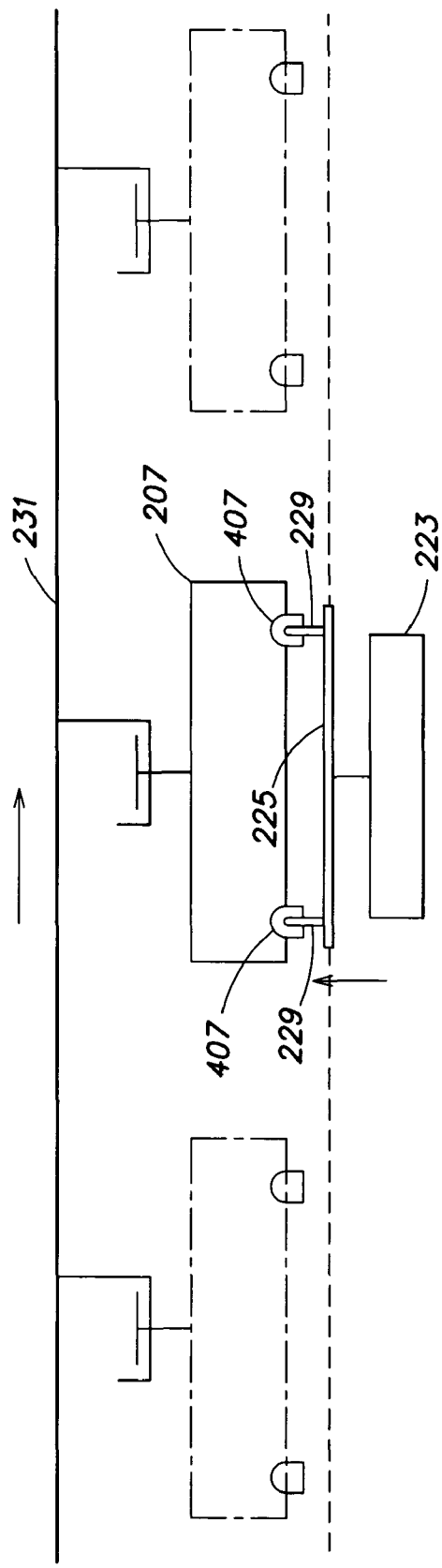

The process of FIG. 8 starts at step 301 and proceeds to step 303. At step 303 the controller 237 receives a signal (e.g., from the sensor 233 or 235) to indicate the presence of a substrate carrier 207 that is being transported by the conveyor 231 and that is to be unloaded from the conveyor 231 by the substrate loading station 201 (a "target substrate carrier 207"). For example, with reference to FIG. 2B, the sensor pair 233b, 233b' may detect the target substrate carrier 207 as a light beam L associated with the sensor pair 233b, 233b' is blocked by the target substrate carrier 207. Upon receipt of the sensor signal, the controller 237 controls the substrate carrier handler 215 such that the support 223 (with the end effector 225 attached thereto) is accelerated in the same direction of travel as the conveyor 231 (e.g., to the right in FIG. 7A) to substantially match the position and speed of the target substrate carrier 207 (step 305, FIG. 8). FIG. 9A illustrates this stage of the process of FIG. 8.

In at least one embodiment of the invention, prior to accelerating the end effector 225 so that it substantially matches the position and speed of the target substrate carrier 207 (step 305), the controller 237 employs the sensor 233 (or one or more of the encoders 240a, 240b) to determine a speed of the conveyor 231. Position of the conveyor 231 also may be determined. As stated, the sensor 233 may comprise a first sensor pair 233a, 233a' (FIG. 7B) for detecting a speed of the conveyor 231 (and/or the speed with which a substrate carrier 207 is being transported by the conveyor 231), and a second sensor pair 233b, 233b' for detecting whether a substrate carrier 207 is being transported by the conveyor 231. Such a speed and/or position determination may be performed prior to or during the unloading of each target substrate carrier 207, periodically, continuously or at some other interval.

Based on the speed of the conveyor 231, the controller 237 may determine a motion profile for the end effector 225 and direct motion of the end effector 225 in accordance with the motion profile to substantially match the speed and position of the end effector 225 and target substrate carrier 207. The motion profile may be "predetermined", such that the controller 237 only allows the end effector 225 to begin performing an unload operation (e.g., begin accelerating) if the speed of the conveyor 231 is within a predetermined speed range (e.g., a range that ensures that the end effector 225 will be properly aligned with the target substrate carrier 207 if the end effector 225 is accelerated, moved and/or positioned in accordance with the predetermined motion profile); otherwise, the process of FIG. 8 ends. Such a predetermined motion profile may be employed even if the speed of the conveyor 231 is not measured (e.g., assuming the speed of the conveyor 231 is maintained within a predetermined speed range that ensures that the end effector 225 will be properly aligned with the target substrate carrier 207 if the end effector 225 is accelerated in accordance with the predetermined motion profile).

The controller 237 may employ the speed of the conveyor 231 to determine a motion profile for the end effector 225, for example, using a look up table of predetermined motion profiles, using an algorithm to calculate the motion profile, etc. It will be understood that substrate carrier speed, rather than conveyor speed may be measured and employed to determine a motion profile or whether to employ a predetermined motion profile for the end effector 225. Each motion profile may include all of the accelerations, decelerations, raisings and lowerings (described below) employed by the end effector 225 during an unload operation.

As stated, in at least one embodiment of the invention, the conveyor 231 may comprise a ribbon-shaped band (e.g., of stainless steel or another suitable material) as described in previously incorporated U.S. patent application Ser. No. 60/443,087, filed Jan. 27, 2003. In such an embodiment, the conveyor 231 may be provided with slots or other openings (e.g., slot 231a in FIG. 7B) spaced along the conveyor 231 at predetermined spacings, through which a light beam of sensor pair 233a, 233a' (FIG. 7B) may pass as the slots of the conveyor 231 travel by the sensor pair 233a, 233a'. By measuring the time between two successive transmissions of the light beam of sensor pair 233a, 233a' through the conveyor 231 (via two successive slots in the conveyor) and with knowledge of the distance between the two successive slots, the speed of the conveyor 231 may be determined. The position of the slots 231a above each substrate carrier 207 (FIG. 7C) also provide the controller 237 with conveyor 231 and/or substrate carrier 207 position information.

In one more embodiment of the invention, the encoders 240a, 240b (FIG. 7A) may be employed to directly read conveyor speed. For example, each encoder 240a, 240b may provide conveyor speed information to the controller 237 and the controller 237 may compare the information received from the encoders 240a, 240b as part of an error checking or confidence routine. Such speed monitoring may be performed periodically, continuously or at any other interval. By measuring conveyor speed directly (e.g., via one or more encoders or other positioning devices), and by determining band position via the sensor 233 (e.g., and slots 231a) handoffs of substrate carriers between the end effector 225 and the conveyor 231, while the conveyor 231 is in motion, may be precisely performed as described further below.

In FIG. 9A the target substrate carrier 207 is shown being transported by the conveyor 231 by means of a carrier engagement member 401 which engages a top flange 402 of the substrate carrier 207. Other configurations for supporting the substrate carrier 207 may be employed (e.g., one or more mechanisms for supporting the substrate carrier 207 by its sides, bottom or the like). One such configuration for the carrier engagement member 401 is described in previously incorporated U.S. patent application Ser. No. 60/443,153, filed Jan. 27, 2003.

An arrow 403 indicates the direction of motion of the conveyor 231. The end effector 225 of the substrate carrier handler 215 is illustrated in FIG. 9A in a position below the target substrate carrier 207 and being moved (as indicated by an arrow 405) in the same direction as the conveyor 231 at a speed that substantially matches the speed of the target substrate carrier 207. The end effector 225 thereby substantially matches a velocity (e.g., speed and direction) of the target substrate carrier 207. In addition, the end effector 225 substantially matches a position of the target substrate carrier 207. More generally, the end effector 225 substantially matches a motion (velocity and/or position) of the target substrate carrier 207. As used herein, "substantially matches" means sufficiently matches so that a substrate carrier may be unloaded from and/or loaded onto a moving conveyor and/or carrier engagement member without damaging a substrate contained within the substrate carrier and/or generating potentially damaging particles.

In the embodiment shown in FIG. 9A, the target substrate carrier 207 moves with the conveyor 231. Accordingly, the end effector 225 also substantially matches the speed, velocity, motion and/or position of the conveyor 231. There may be embodiments in which the conveyor 231 moves at a different rate, or not at all, relative to the target substrate carrier 207. For example, the carrier engagement member 401 itself may move the target substrate carrier 207 along the conveyor 231. In this later embodiment, the end effector 225 may not substantially match the speed, velocity and/or position of the conveyor 231.

In one or more embodiments of the invention, the end effector 225 may not be positioned at the same location as the trigger (or launch) sensor (e.g., sensor pair 233b, 233b' of FIG. 2B) that detects the presence of the target substrate carrier 207 on the conveyor 231. In such instances, it may be necessary to delay acceleration of the end effector 225 in step 305 to compensate for the differing positions of the end effector 225 and the trigger sensor. This "launch offset" may depend on, for example, the distance between the end effector 225 and the trigger sensor, the speed of the conveyor 231, etc. A launch offset may be separate from or built into a motion profile for the end effector 225.

Figure 7C:
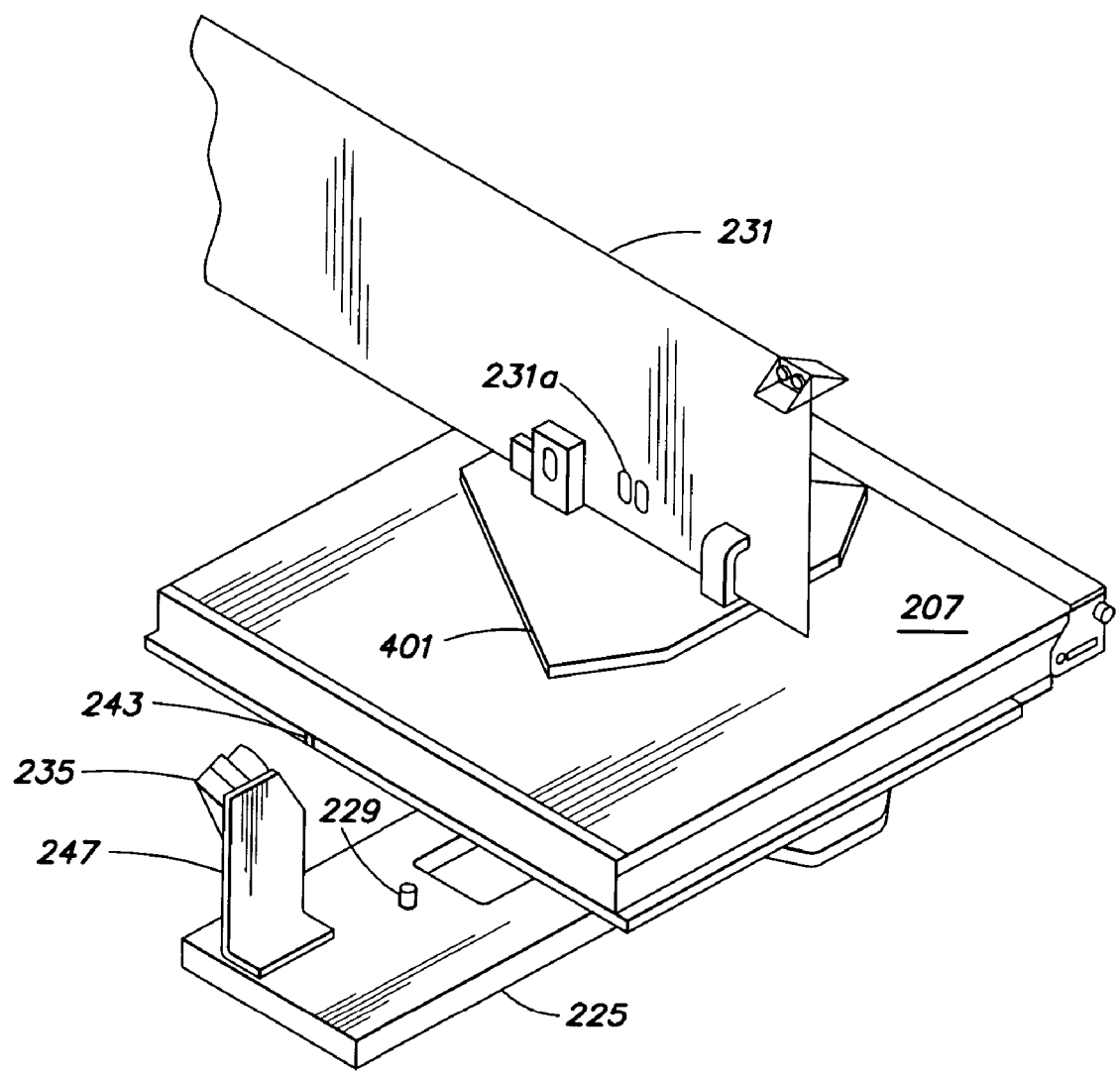
FIG. 7C is a perspective view of a portion of the end effector of FIG. 7A illustrating an exemplary second sensor of the substrate loading station of FIG. 7A.
Figure 7D:
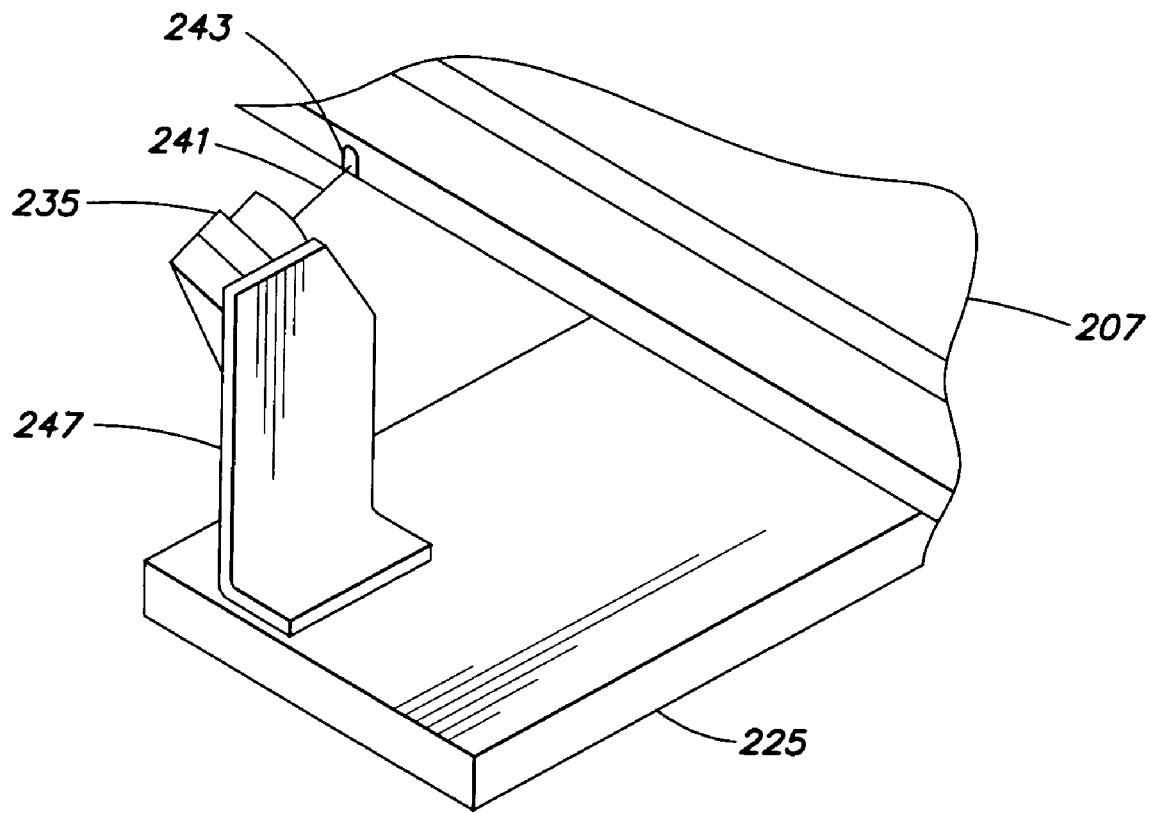
FIG. 7D is an enlarged perspective view of a portion of FIG. 7C.

Referring again to FIG. 3, at step 307, the position of the target substrate carrier 207 relative to the end effector 225 is detected (e.g., via a signal or signals from the sensor 235 (FIG. 7A)). For example, if the sensor 235 comprises a light source/detector pair, such as a Model No. QS30 sensor system available from Banner, Inc. or the like, the sensor 235 may emit a beam of light toward the target substrate carrier 207 that is only detected by the sensor 235 if the end effector 225 is properly positioned relative to the target substrate carrier 207 (e.g., by providing the substrate carrier 207 with an appropriate reflective surface and/or surface topography such as an angled notch that reflects light toward the sensor 235 only when the end effector 225 is properly positioned relative to the substrate carrier 207). FIG. 7C is a perspective view of a portion of the end effector 225 illustrating an exemplary sensor 235 positioned to detect a light beam 241 (FIG. 7D) reflected from a notch 243 formed in a portion of a target substrate carrier 207 when the end effector 225 is properly positioned relative to the target substrate carrier 207. FIG. 7D is an enlarged perspective view of a portion of FIG. 7C. As shown in FIGS. 7C–D, the sensor 235 may be coupled to the end effector 225 via a suitable bracket or other support structure 247. Other configurations may be employed.

In at least one embodiment of the invention, if the end effector 225 is not properly positioned relative to the target substrate carrier 207, then the process of FIG. 8 ends.

Alternatively, in another embodiment of the invention, any necessary adjustments in the position of the end effector 225 relative to the target substrate carrier 207 may be made (step 309). For example, the controller 237 may accelerate and/or decelerate the end effector 225 until a proper alignment signal is received from the sensor 235 so as to ensure that kinematic pins 229 (FIG. 9A) are properly positioned below alignment features (e.g., concave or otherwise-shaped features 407) of the target substrate carrier 207. It will be appreciated that the steps 307 and 309 are performed while the target substrate carrier 207 and the end effector 225 are in motion, and are performed so that the end effector 225 is positioned below the target substrate carrier 207 while substantially matching speed therewith. Accordingly, the end effector 225 is moved so as to remain adjacent and below the target substrate carrier 207 while the target substrate carrier 207 is in motion. It will be understood that the relative position of the target substrate carrier 207 and the end effector 225 may be detected and adjusted numerous times (or continuously), and that a feedback control loop (not shown) may be employed to ensure that the speed and/or position of the end effector 225 remain substantially matched with that of the target substrate carrier 207. In yet another embodiment of the invention, steps 307 and 309 may be eliminated (e.g., if a predetermined motion profile is employed that is correlated to the speed of the conveyor 231 and launch time/position of the end effector 225). In such an embodiment, the sensor 235 may be eliminated.

In place of or in addition to the sensor 235, the encoder 240a and/or 240b may be employed to monitor conveyor speed during an unload operation. In response to gross deviations in conveyor speed during an unload operation, the controller 237 may abort the unload operation (e.g., by employing another motion profile that ensures that the end effector 225 does not interfere with the conveyor 231 or substrate carriers being transported thereby). Alternatively, for small conveyor speed variations, the controller 237 may adjust end effector position (e.g., via accelerations or decelerations) to ensure proper unload (or load) operations. A closed loop system comprising the end effector 225, the sensor 233, the encoders 240a and/or 240b and/or the controller 237 thereby may ensure proper unload (or load) operations despite conveyor speed variations.

Figure 9C:
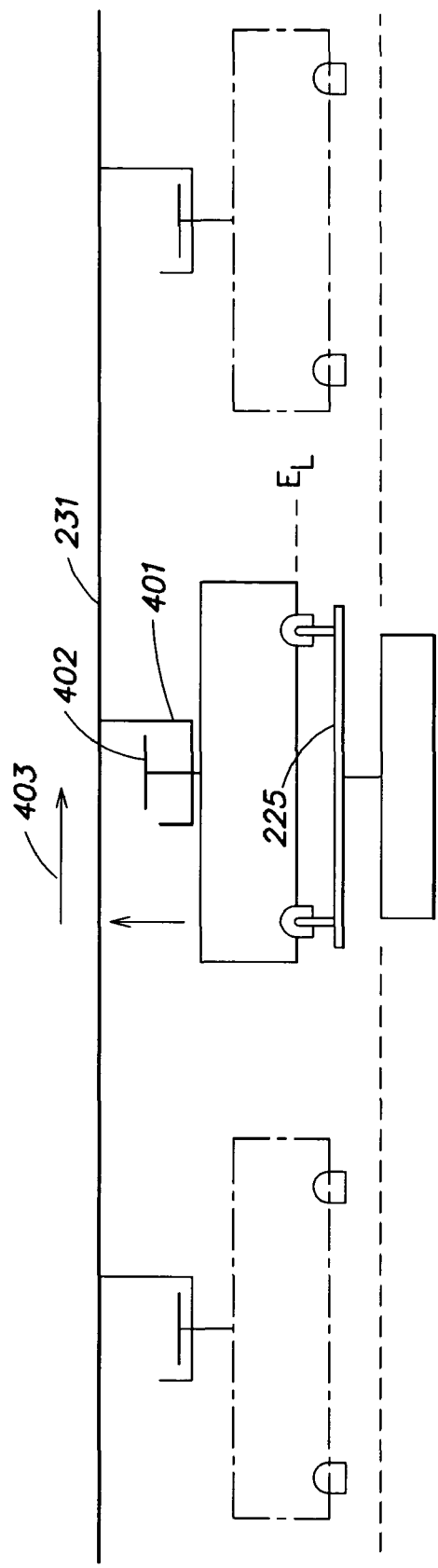

Assuming the end effector 225 is properly positioned relative to the target substrate carrier 207, following step 307 and/or step 309 in the process of FIG. 3 is step 311. At step 311, the controller 237 controls the substrate carrier handler 215 such that the end effector 225 is raised (e.g., the horizontal guide 221 is raised on the vertical guides 217, 219 to raise the end effector 225) while continuing to substantially match the horizontal speed (and/or instantaneous position) of the end effector 225 to the speed (and/or instantaneous position) of the target substrate carrier 207. The raising of the end effector 225 causes the kinematic pins 229 thereof to come into engagement with concave features 407 on the bottom of the target substrate carrier 207. Thus the end effector 225 is moved to an elevation at which the conveyor 231 transports substrate carriers 207. In this manner, the end effector 225 contacts the bottom of the target substrate carrier 207 (as shown in FIG. 5B). In one or more embodiments of the invention, the end effector 225 preferably contacts the target substrate carrier 207 with substantially zero velocity and/or acceleration as described further below with reference to FIGS. 13A–D. As the end effector 225 continues to be raised (while the end effector continues to substantially match horizontal speed and/or position with the target substrate carrier 207), the target substrate carrier 207 (and in particular its top flange 402) is lifted out of engagement with the carrier engagement member 401 of the conveyor 231, as illustrated in FIG. 9C.

Figure 9D:
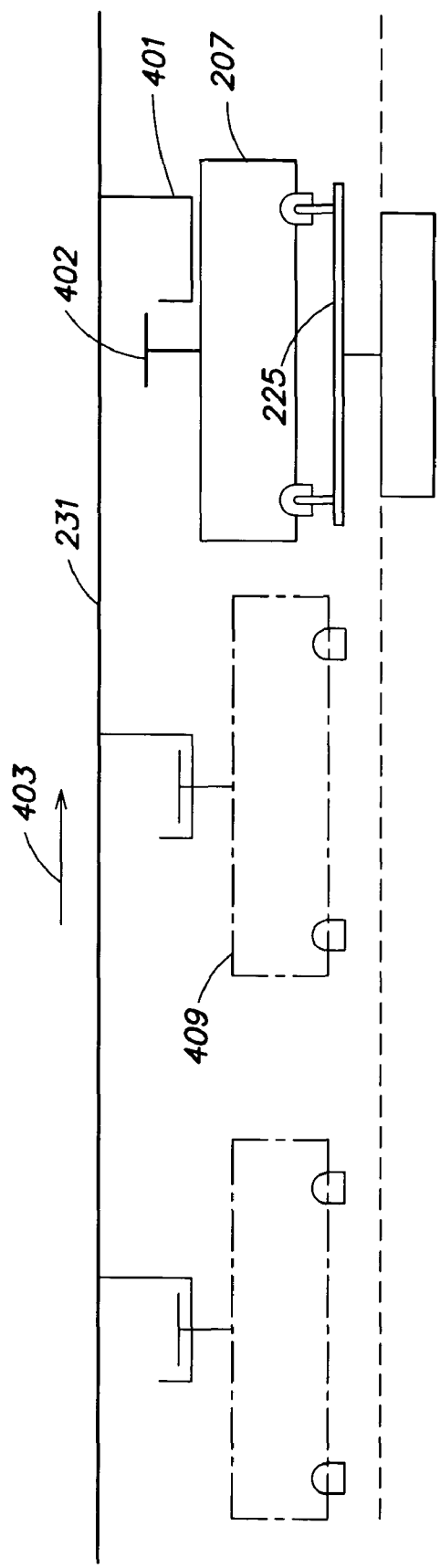

Next, in step 313 of FIG. 8, the controller 237 controls the substrate carrier handler 215 to decelerate horizontal motion of the end effector 225 slightly, thereby decelerating the target substrate carrier 207. The degree of deceleration is such that the target substrate carrier 207 continues to move in the direction indicated by the arrow 403, but at a slower speed than the conveyor 231. This allows the carrier engagement member 401 (which had engaged the flange 402 of the target substrate carrier 207) to move ahead of the flange 402, as indicated in FIG. 9D. Once the carrier engagement member 401 has moved out from underneath the flange 402 (as shown in FIG. 9D), the end effector 225 may be accelerated again, so that the horizontal speed of the end effector 225 and the target substrate carrier 207 supported thereon again substantially matches the horizontal speed of the conveyor 231 to prevent another substrate carrier being transported by the conveyor 231 (e.g., substrate carrier 409 in FIG. 9D) from colliding with the target substrate carrier 207.

Figure 9E:
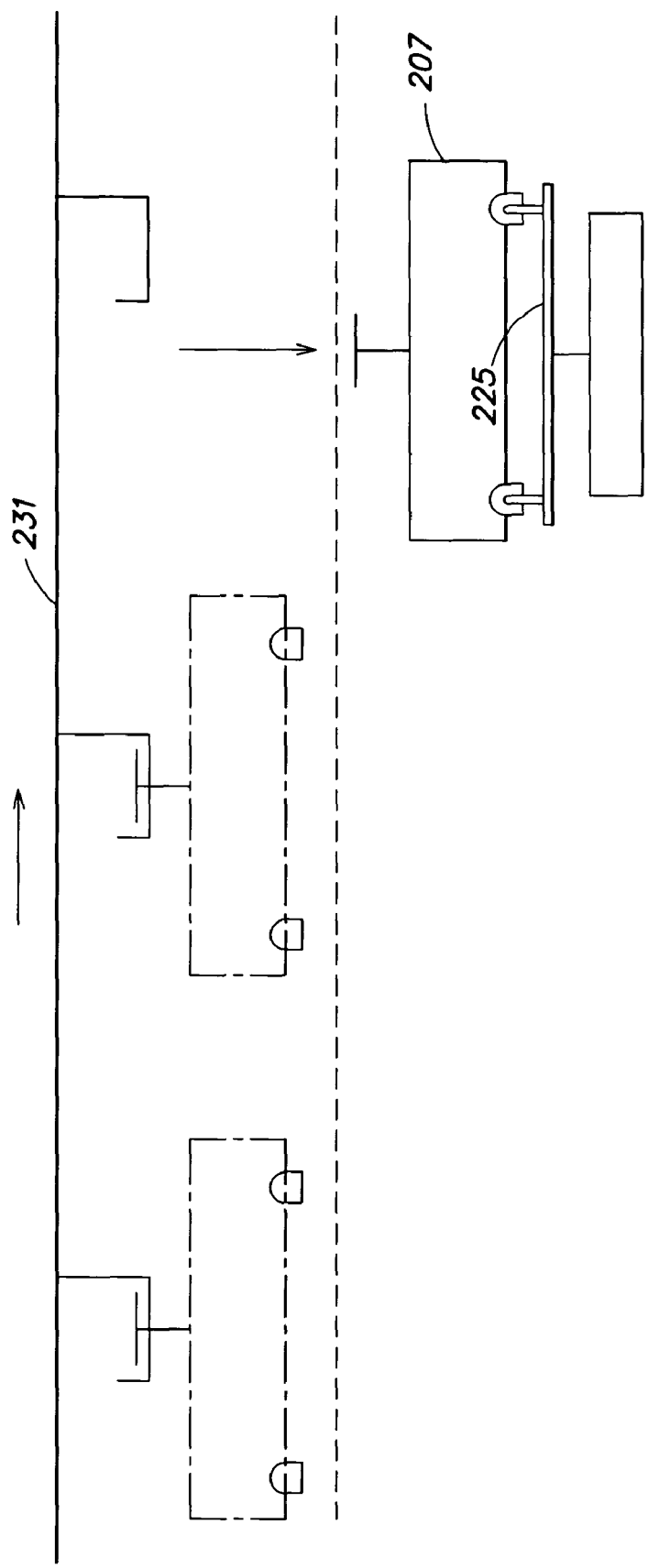

In step 315 in FIG. 3, the end effector 225 is lowered (e.g., by lowering the horizontal guide 221 along the vertical guides 217, 219) to lower the target substrate carrier 207 away from the conveyor 231. The lowering of the target substrate carrier 207 is illustrated in FIG. 9E. The end effector 225, having the target substrate carrier 207 supported thereon, may then be decelerated (step 317, FIG. 8) and brought to a halt. As stated, in at least one embodiment of the invention, the above-described end effector 225 accelerations, decelerations, raisings and/or lowerings may be defined by the motion profile determined for the end effector 225. (Exemplary motion profiles are described below with reference to FIGS. 13A–D).

In step 319, the substrate carrier handler 215 may transport the target substrate carrier 207 supported on the end effector 225 to one of the docking stations 203 (FIG. 7A). Alternatively, if the loading station 201 includes one or more storage shelves or other storage locations (e.g., storage shelf 239, shown in phantom in FIG. 7A, and adapted to store a substrate carrier), the substrate carrier handler 215 may transport the target substrate carrier 207 to one of the storage locations. (Other and/or more storage locations may be employed). The process of FIG. 8 then ends in step 321.

Assuming that the target substrate carrier 207 is brought to one of the docking stations 203, the target substrate carrier 207 may be handed off by the substrate carrier handler 215 to the docking gripper 211 of the respective docking station 203. The target substrate carrier 207 then may be docked at the docking station 203, and opened by the substrate carrier opener 213 of the docking station 203 to allow extraction of a target substrate from the target substrate carrier 207 (e.g., by a substrate handler such as the FI robot 31A of FIG. 1). The extracted substrate may be transferred to a processing tool associated with the substrate loading station 201 (e.g., the processing tool of FIG. 1) and one or more fabrication processes may be applied to the substrate by the processing tool. Upon completion of the processing in the processing tool, the substrate may be returned to the target substrate carrier 207 at the docking station 203 and the target substrate carrier 207 may be closed and undocked from the docking station 203. The substrate carrier handler 215 then may transport the target substrate carrier 207 away from the docking station 203 and to a position just below the conveyor 231 (e.g., assuming the substrate carrier 207 is to be returned to the conveyor 231 rather than stored at a storage location such as the storage location 239). That is, with the substrate carrier 207 supported on the end effector 225, the horizontal guide 221 may be moved near the upper ends 217a, 219a of the vertical guides 217, 219, and the support 223 may be moved to the upstream end 221a of the horizontal guide 221. The substrate carrier 207 then may be transferred back onto the conveyor 231 as described below with reference to FIGS. 10–11E.

Figure 10:
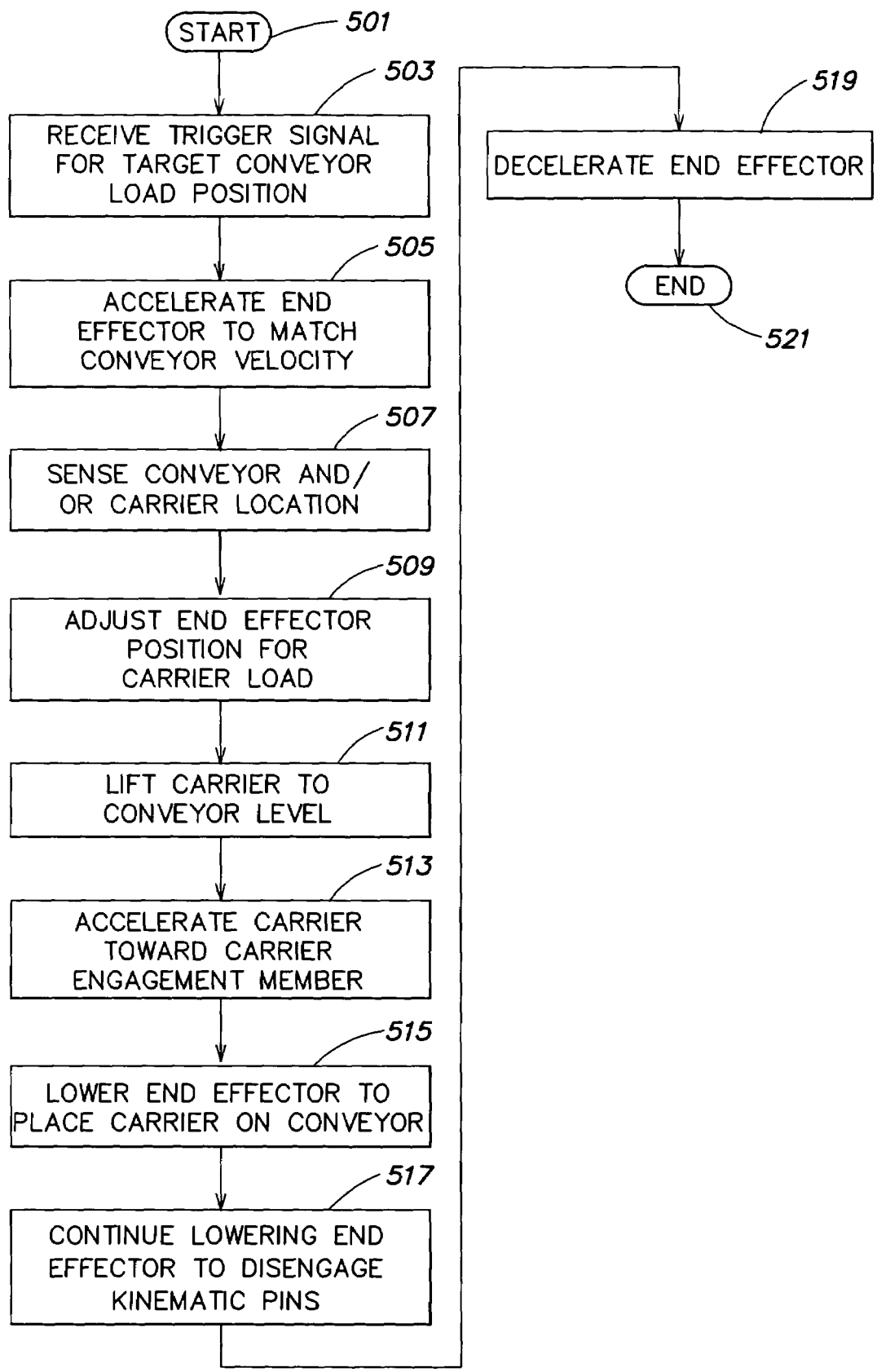
FIG. 10 is a flow chart that illustrates an exemplary process performed in accordance with the invention to load a substrate carrier onto a moving conveyor.

An exemplary process that may be performed in accordance with the invention for loading a target substrate carrier 207 onto the conveyor 231 will now be described with reference to FIGS. 10–11E. FIG. 10 is a flow chart that illustrates the inventive substrate carrier loading process. FIGS. 11A–E are schematic side views showing various stages of the process of FIG. 10.

The process of FIG. 5 starts at step 501 and continues with step 503. At step 503 the controller 237 receives a signal (e.g., from the sensor 233 or 235) indicating the presence of a vacant carrier engagement member 401 of the conveyor 231. In response to this signal, in step 505, the controller 237 controls the substrate carrier handler 215 so that the end effector 225 (with the target substrate carrier 207 to be transferred to the conveyor 231 thereon) is accelerated along the horizontal guide 221 to substantially match the motion of the vacant carrier engagement member 401 (and/or the conveyor 231). For example, the end effector 225 may substantially match the speed and position of the vacant carrier engagement member 401 in the horizontal direction. As stated previously, in one or more embodiments, the end effector 225 may not be positioned at the same location as the trigger sensor (e.g., sensor pair 233b, 233b' of FIG. 7B). In such instances it may be necessary to delay acceleration of the end effector 225 in step 505 to compensate for the differing positions of the end effector 225 and the trigger (or launch) sensor.

In at least one embodiment of the invention, prior to accelerating the end effector 225 so that it substantially matches the position and speed of the vacant carrier engagement member 401 (step 505), the controller 237 employs the sensor 233 or one or more encoders 240a, 240b coupled to the conveyor 231 to determine a speed of the conveyor 231. Position of the conveyor 231 also may be determined. Based on the speed of the conveyor 231, the controller 237 may determine a motion profile for the end effector 225 and direct motion of the end effector 225 in accordance with the motion profile to substantially match the speed and position of the end effector 225 (with the target substrate carrier 207 thereon) to the vacant carrier engagement member 401 onto which the target substrate carrier 207 is to be loaded. The motion profile may be "predetermined", such that the controller 237 only allows the end effector 225 to begin performing a load operation (e.g., begin accelerating) if the speed of the conveyor 231 is within a predetermined speed range (e.g., a range that ensures that the end effector 225 will be properly aligned with the vacant carrier engagement member 401 if the end effector 225 is accelerated in accordance with the predetermined motion profile); otherwise, the process of FIG. 10 ends.

Alternatively, the controller 237 may employ the speed of the conveyor 231 to determine a motion profile for the end effector 225, for example, using a look up table of predetermined motion profiles, using an algorithm to calculate the motion profile, etc. It will be understood that carrier engagement member speed, rather than conveyor speed may be measured and employed to determine a motion profile or whether to employ a predetermined motion profile for the end effector 225. Each motion profile may include all of the accelerations, decelerations, raisings and lowerings (described below) employed by the end effector 225 during a load operation. (Exemplary motion profiles are described below with reference to FIGS. 13A–D).

Figure 11A:
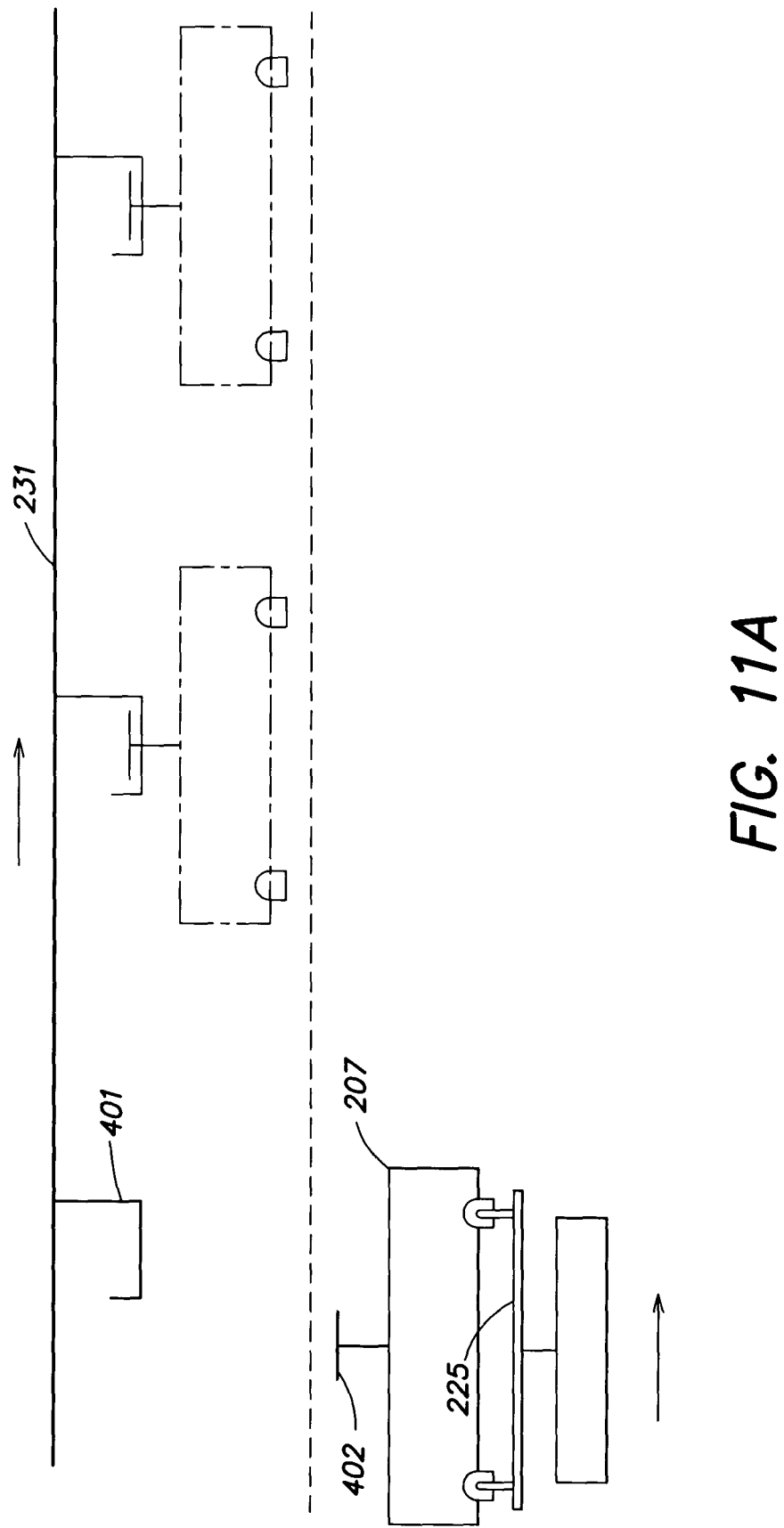
FIGS. 11A–11E are schematic side views showing various stages of the process of FIG. 10.

FIG. 11A shows the end effector 225 being moved at a substantially matching velocity with the conveyor 231, and with the flange 402 of the target substrate carrier 207 below and slightly behind the carrier engagement member 401 on which the target substrate carrier 207 is to be loaded. In this manner, the target substrate carrier 207 may be raised without the flange 402 being obstructed by the carrier engagement member 401 during transfer of the target substrate carrier 207 to the conveyor 231 as described below. In general, the flange 402 of the target substrate carrier 207 may be positioned at any location that allows the target substrate carrier 207 to be raised without contacting the carrier engagement member 401 on which the target substrate carrier 207 is to be loaded and the carrier engagement member (and/or a substrate carrier positioned thereon) that follows the carrier engagement member 401 on which the target substrate carrier 207 is to be loaded.

Following step 505 is step 507 at which the relative horizontal positioning of the target substrate carrier 207 and the carrier engagement member 401 are sensed (e.g., by the sensor 235, FIG. 7A). For example, if the sensor 235 comprises a light source/detector pair, the sensor 235 may emit a beam of light toward the vacant carrier engagement member 401 (or the conveyor 231) that is only detected by the sensor 235 if the end effector 225 is properly positioned relative to the vacant carrier engagement member 401 (as described previously with reference to FIGS. 7C–D).

Figure 7E:
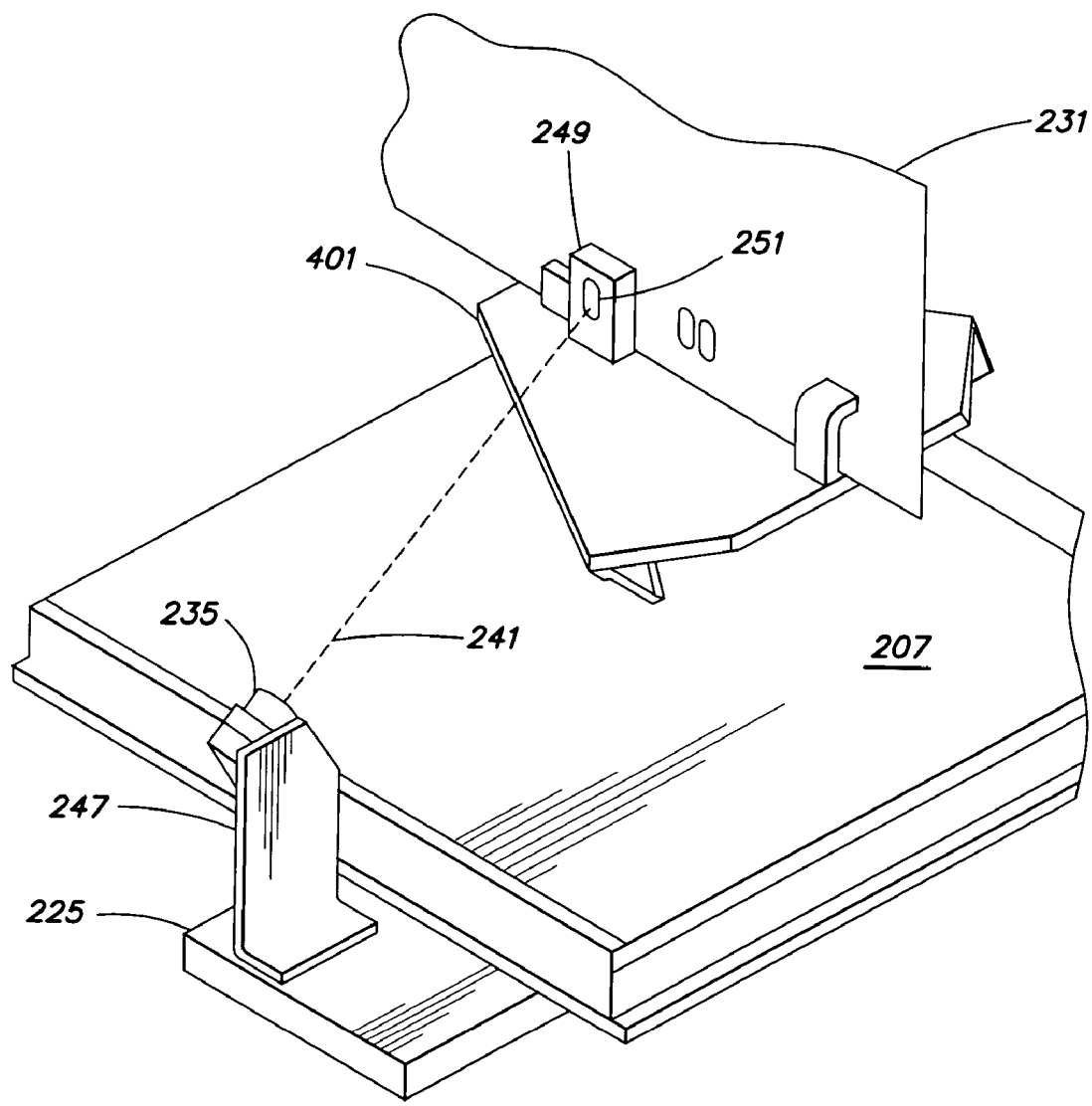
FIG. 7E is a perspective view of a portion of the end effector of FIG. 7A illustrating the second sensor positioned to detect a portion of a carrier engagement member.

FIG. 7E is a perspective view of a portion of the end effector 225 illustrating the sensor 235 positioned to detect a portion 249 of a carrier engagement member 401 that couples the carrier engagement member 401 to the conveyor 231. Specifically, the portion 249 of the carrier engagement member 401 comprises a notch 251 that is angled to reflect light beam 241 (emitted by the sensor 235) back toward the sensor 235 when the end effector 225 is properly positioned below the carrier engagement member 401 for a load operation. Other configurations may be employed. For example, the one or more encoders 240a, 240b or other positioning devices that directly measure conveyor speed may provide such information to the controller 237 (e.g., continuously) such that the controller 237 may track conveyor position during a load (or unload) operation.

In at least one embodiment of the invention, if the end effector 225 is not properly positioned relative to the vacant carrier engagement member 401, then the process of FIG. 11 ends. Alternatively, in another embodiment of the invention, in step 509 any necessary adjustments may be made in the relative horizontal positioning of the target substrate carrier 207 and the carrier engagement member 401 (e.g., to ensure that the flange 402 does not contact the carrier engagement member 401 when the target substrate carrier 207 is raised as described below). For example, the controller 237 may accelerate and/or decelerate the end effector 225 until a proper alignment signal is received from the sensor 235. During such position adjustment, the horizontal speed of the target substrate carrier 207 and the horizontal speed of the conveyor 231 and/or the carrier engagement member 401 may remain substantially matched. In yet another embodiment of the invention, steps 507 and 509 may be eliminated (e.g., if a predetermined motion profile is employed that is correlated to the speed of the conveyor 231 and/or launch time/position of the end effector 225). In such an embodiment, the sensor 235 may be eliminated.

Figure 11B:
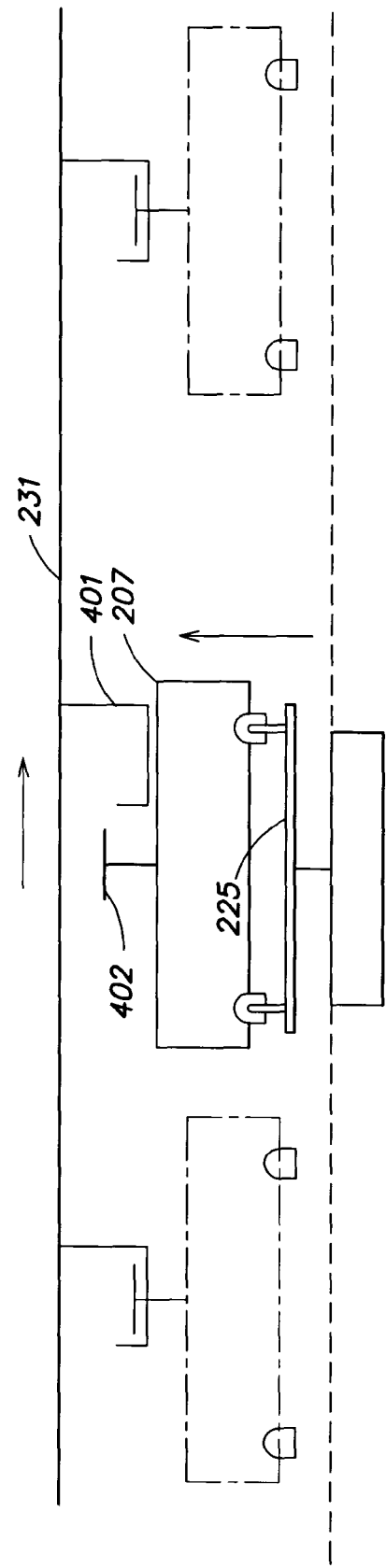

Assuming the end effector 225 is properly positioned relative to the vacant carrier engagement member 401, in step 511, and shown in FIG. 11B, the end effector 225 is raised, by raising the horizontal guide 221 along the vertical guides 217, 219 (FIG. 7A), so that the target substrate carrier 207 and particularly its flange 402, are brought up to the level of the carrier engagement member 401. As shown in FIG. 11B, the flange 402 is positioned slightly above the carrier engagement member 401 (e.g., for loading thereon as described below).

Figure 11C:
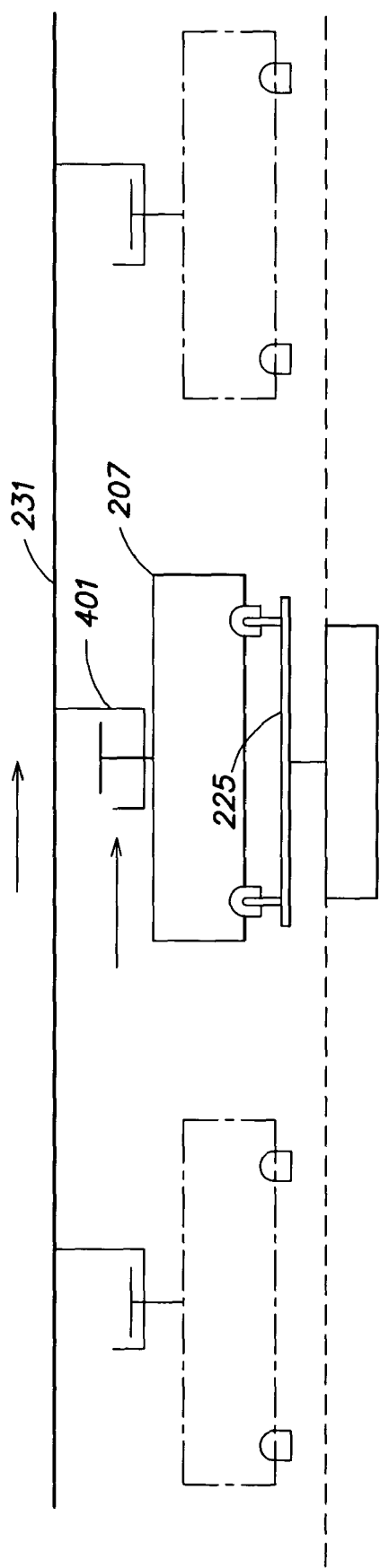
Figure 11D:
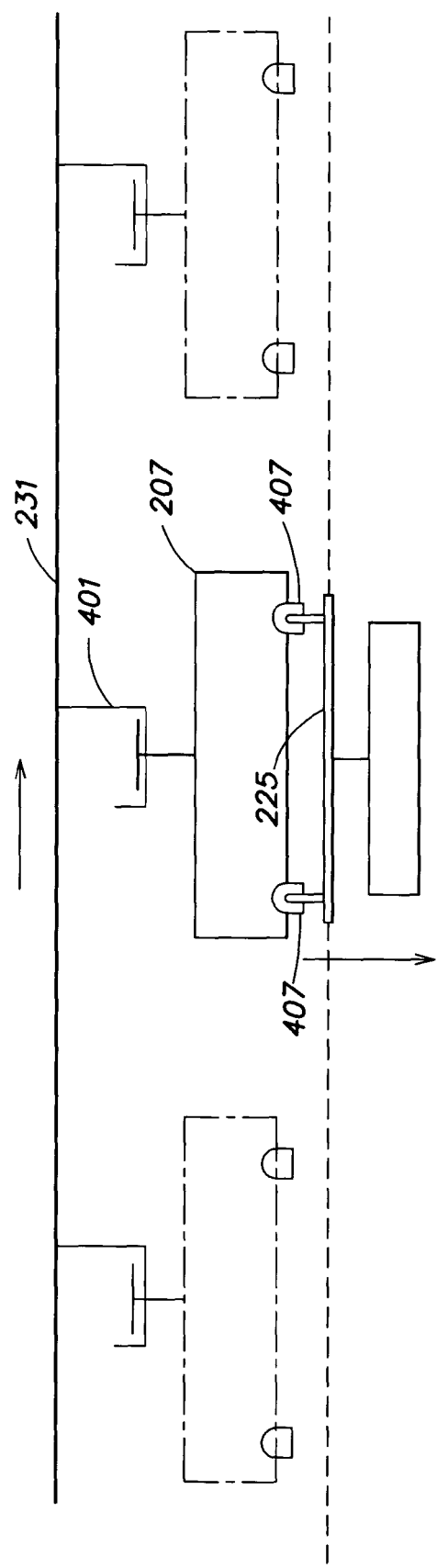
Figure 11E:
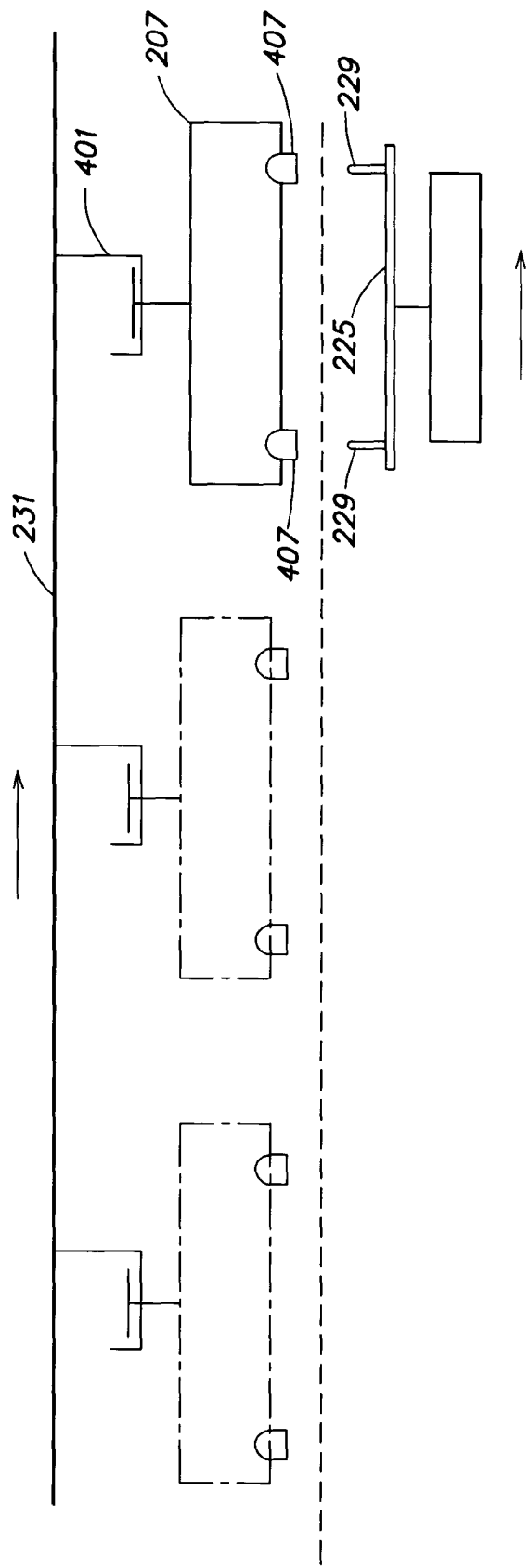

Next, as represented by step 513 and shown in FIG. 11C, the target substrate carrier 207 is accelerated to bring the flange 402 of the target substrate carrier 207 above the carrier engagement member 401 of the conveyor 231. The target substrate carrier 207 is then decelerated, so that the horizontal speed of the target substrate carrier 207 again substantially matches the horizontal speed of the conveyor 231. Next, as illustrated in FIG. 11D and represented by step 515, the end effector 225 is lowered (while continuing to substantially match the horizontal speed of the conveyor 231), to bring the flange 402 of the target substrate carrier 207 into engagement with the carrier engagement member 401 of the conveyor 231, thereby handing off the target substrate carrier 207 to the carrier engagement member 401. In one or more embodiments of the invention, the target substrate carrier 207 preferably contacts the carrier engagement member 401 with substantially zero velocity and/or acceleration as described further below with reference to FIGS. 13A–13B. The substrate carrier handler 215, under control of the controller 237, continues to lower the end effector 225, (e.g., while continuing to substantially match the horizontal speed of the conveyor 231), so that the kinematic pins 229 of the end effector 225 are disengaged from the features 407 on the bottom of the target substrate carrier 207. An exemplary result of step 517 is illustrated in FIG. 11E.

After the end effector 225 is disengaged from the target substrate carrier 207, in step 519 the end effector 225 is decelerated (e.g., halted) and the process of FIG. 5 ends (step 521). Meanwhile, the target substrate carrier 207, which is supported via its flange 402 by the carrier engagement member 401 of the conveyor 231, is transported away from the loading station 201 by the conveyor 231. As stated, in at least one embodiment of the invention, the above-described end effector 225 accelerations, decelerations, raisings and/or lowerings may be defined by the motion profile determined for the end effector 225.

Thus the substrate loading station 201 provided in accordance with the invention, and in particular the substrate carrier handler 215 operating under the control of the controller 237, functions to unload substrate carriers from a moving conveyor and to load substrate carriers onto the moving conveyor. In this manner, the inventive substrate loading station and substrate carrier handler may reduce substrate dwell time within a fabrication facility, work-in-progress, and working capital and manufacturing costs.

In accordance with the invention, the controller 237 may be programmed to perform one or both of the processes of FIGS. 8 and 10. Also the processes of FIGS. 8 and 10 may be embodied in one or more computer program products. Each computer program product may be carried by a medium readable by a computer (e.g., a carrier wave signal, a floppy disk, a hard drive, a random access memory, etc.).

In at least one embodiment of the invention, the inventive substrate loading station 201 may be configured to automatically retract the end effector 225 away from the conveyor 231 in the event of a power failure, emergency shutdown, etc. For example, the controller 237 may include an end effector retraction routine which automatically retracts the end effector 225 (and/or the horizontal guide 221) away from the conveyor 231 in response to a predetermined interrupt such as a power failure, emergency shutdown, or the like. Further, the end effector 225 (and/or the horizontal guide 221) may be biased so that the end effector 225 (and/or the horizontal guide 221) automatically retracts when power is removed from the substrate loading station 201. Any suitable biasing mechanism such as springs, gravity, air cylinders, ball screws, lead screws, etc., may be employed. The above mentioned end effector retraction routine may be implemented, for example, as one or more computer program products.

Exemplary parameters that may affect design of the substrate loading station 201 include, for example, (1) conveyor speed; (2) horizontal and/or vertical speed at which the substrate carrier handler 215 can move the end effector 225; (2) horizontal and/or vertical acceleration and deceleration that may be applied to the end effector 225 of the substrate carrier handler 215; (4) horizontal and vertical range of movement of the end effector 225 of the substrate carrier handler 215; (5) distance between adjacent substrate carriers 207 transported by the conveyor 231; (6) elevation at which the conveyor 231 transports the substrate carriers 207; (7) vertical distance a substrate carrier 207 should be lifted to clear the carrier engagement member 401 of the conveyor 231 used to transport the substrate carrier 207; (8) height (e.g., vertical dimension) of each substrate carrier 207; (9) distance a substrate carrier 207 must be lowered, after being released from a carrier engagement member 401, to allow substrate carriers being transported by the conveyor 231 to pass over the released substrate carrier 207 without striking the released substrate carrier 207; (10) the type of carrier engagement member employed; and/or (11) other similar parameters.

For example, in at least one embodiment of the invention, the inventive substrate carrier handler 215 should be capable of (1) achieving a maximum horizontal speed for the end effector 225 that is greater than or equal to the horizontal speed of the conveyor 231; (2) raising the end effector 225 to an elevation sufficient to disengage and clear a substrate carrier 207 from a conveyor carrier engagement member 401; (3) moving at two or more horizontal speeds, such as a first horizontal speed for matching conveyor speed and a second horizontal speed for transporting a substrate carrier 207 to and from a docking station 203; (4) moving at two or more vertical speeds, such as a first vertical speed for disengaging a substrate carrier 207 from or handing off a substrate carrier 207 to the conveyor 231, and a second vertical speed for transporting a substrate carrier 207 to and from a docking station 203; and/or (5) performing all accelerations and decelerations of a substrate carrier 207 supported by the end effector 225 (and required for substrate carrier engagement with or disengagement from the conveyor 231) without damaging a substrate or substrates contained in the substrate carrier 207.

Likewise, the substrate carrier handler 215 should operate so as to lower its end effector 225 to a sufficiently low level to service the lowest docking station 203. (If a storage shelf or other storage location is present that is lower than the lowest docking station 203, then the substrate carrier handler 215 should be further operative to lower the end effector 225 to service the lowest storage shelf/location). The horizontal range of travel for the end effector 225 provided on the horizontal guide 221, and the mechanism for moving the end effector 225 should be such that the end effector 225 is able to accelerate to a horizontal speed substantially matching conveyor speed, disengage a substrate carrier 207 from and/or engage a substrate carrier 207 with the conveyor 231 (while avoiding a collision with other substrate carriers being transported on the conveyor 231), and decelerate to a halt, all within the available horizontal range of travel provided by the horizontal guide 221.

It is contemplated to include some or all of the above described features/parameters in one or more embodiments of the inventive substrate loading station.

Figure 12A:
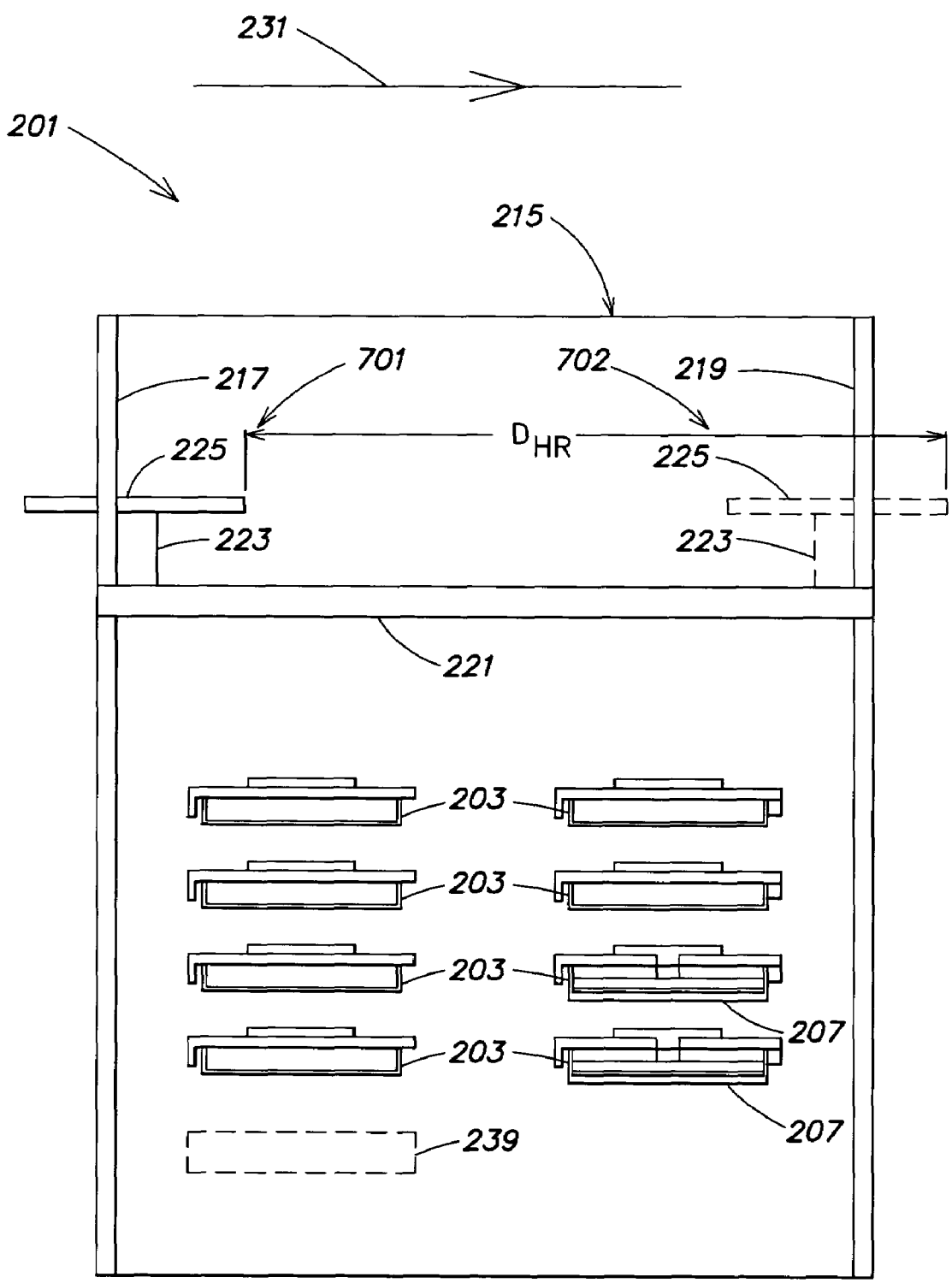
FIGS. 12A and 12B are simplified front elevational views of the inventive substrate loading station, similar to FIG. 7A.
Figure 12B:
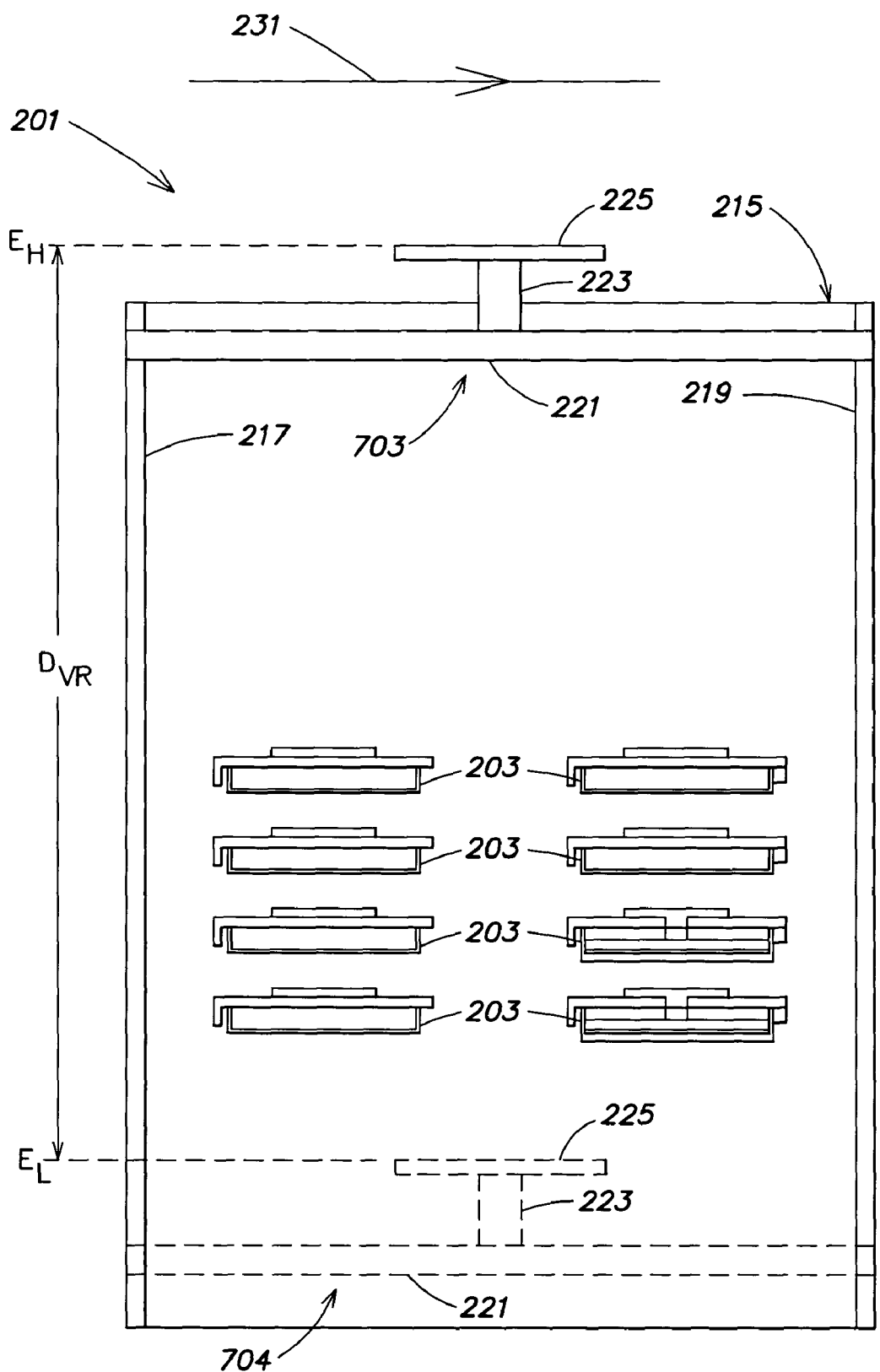
Figure 12C:
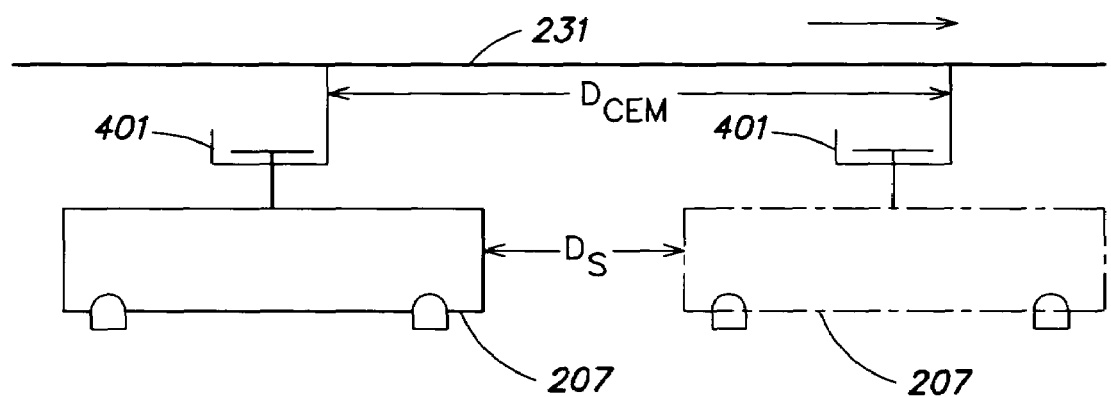
FIGS. 12C–12D are simplified schematic side views illustrating a moving conveyor similar to FIGS. 9A–9E and 11A–11E.
Figure 12D:
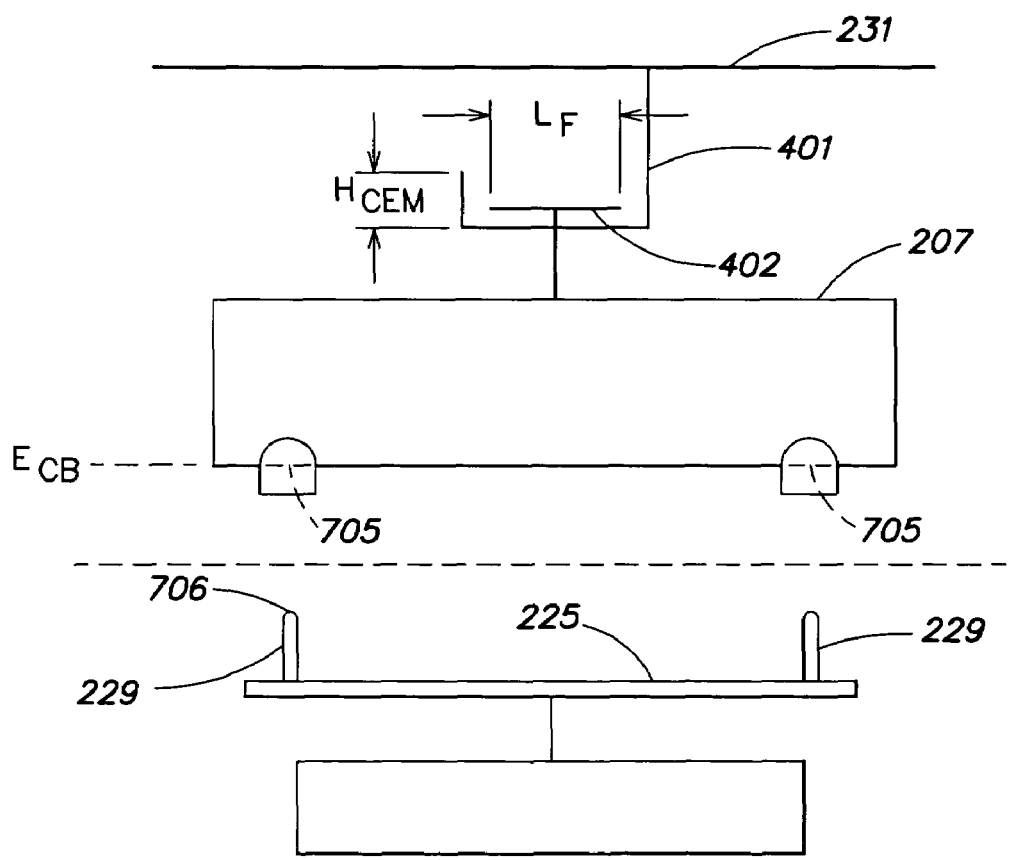

Various factors and parameters that may be considered in designing a particular embodiment of the inventive substrate loading station 201 and/or programming the controller 237 (FIG. 7A) will now be discussed with reference to FIGS. 12A–D. FIGS. 12A and 12B are simplified front elevational views of the inventive substrate loading station 201, similar to FIG. 7A. FIGS. 12C–D are simplified schematic side views of a substrate carrier during engagement with and/or disengagement from the conveyor 231 similar to FIGS. 9A–E and 11A–E.

The horizontal range of the end effector 225 of the substrate carrier handler 215 is illustrated in FIG. 12A. The end effector 225 and the support 223 are shown in solid outline at 701 in a position at the upstream limit of movement of the end effector 225 along the horizontal guide 221 of the substrate carrier handler 215. The end effector 225 and the support 223 are also shown in phantom at 702 in a position at the downstream limit of movement of the end effector 225 along the horizontal guide 221. A distance $D_{HR}$ illustrated in FIG. 12A represents the maximum horizontal range of travel of the end effector 225.

Selection of the horizontal range of travel $D_{HR}$, in addition to being influenced by the design factors discussed above, may also be influenced by the positioning of the docking stations 203 or shelves 239 (e.g., the number and/or horizontal span of the docking stations or shelves), the desired footprint for the substrate loading station 201, the size of the factory interface or processing tool coupled to the substrate loading station 201, and/or the like.

The vertical range of travel of the end effector 225 is illustrated in FIG. 12B. The end effector 225, the support 223 and the horizontal guide 221 are shown in solid outline at 703 at the upper limit of the range of vertical movement of the end effector 225. At that position, the end effector 225 is at an elevation $E_H$, which is high enough to clear the flange 402 of a substrate carrier 207 from a carrier engagement member 401 of the conveyor 231 (see FIGS. 9B–D).

Continuing to refer to FIG. 12B, the end effector 225, the support 223 and the horizontal guide 221 are shown in phantom at 704 at the lower limit of the range of vertical movement of the end effector 225. At that position, the end effector 225 is at an elevation $E_L$, which is the lowest elevation required to service the lowest docking station (or storage location) of the substrate loading station 201. A distance $D_{VR}$ illustrated in FIG. 12B represents the maximum vertical range of travel of the end effector 225 (e.g., $D_{VR}=E_H-E_L$). Other vertical ranges of travel may be employed.

Parameters which affect an operation for engaging or disengaging a substrate carrier 207 from the conveyor 231 are illustrated in FIGS. 12C–D. FIG. 12C shows a distance $D_S$ which separates two adjacent substrate carriers 207 being transported by the conveyor 231. The separation distance $D_S$ is related to, but less than, a distance $D_{CEM}$ between the carrier engagement members 401, and is also related to a horizontal dimension of the substrate carriers 207. Increasing the distance $D_S$ eases load and unload operations by providing a larger space and/or time period for raising, lowering, accelerating and/or decelerating a substrate carrier 207 during load and unload operations. However, increasing the distance $D_S$ generally decreases the number of substrate carriers that may be transported by the conveyor 231.

As shown in FIG. 12D, in at least one embodiment of the invention, to disengage a substrate carrier 207 from the conveyor 231, the end effector 225 raises the kinematic features 229 to an elevation equal to at least the elevation $E_{CB}$ of the bottom of the substrate carrier 207. More specifically, the kinematic features 229 are raised to an elevation greater than or equal to the elevation $E_{CB}$ plus the height $H_{CEM}$ of the seat of the carrier engagement member 401 supporting the substrate carrier 207 (e.g., to clear the flange 402 of the substrate carrier 207 from the carrier engagement member 401). Prior to lowering the disengaged substrate carrier 207, the end effector 225 is decelerated to allow the carrier engagement member 401 to move ahead of the substrate carrier 207 by a total distance greater than a length $L_F$ of the flange 402. Numerous other parameters may affect design of the inventive substrate loading station 201 and substrate handler 215.

The foregoing description discloses only an exemplary embodiment of the invention; modifications of the above disclosed apparatus and methods which fall within the scope of the invention will be readily apparent to those of ordinary skill in the art. For example, instead of employing two vertical guides in the substrate carrier handler illustrated above, only one vertical guide may be employed. Also, the substrate carrier handler may be arranged with a vertical guide that is coupled for horizontal movement along a horizontal guide instead of the horizontal guide coupled for vertical movement along vertical guides.

When the substrate carrier handler includes a vertical guide mounted for movement along a horizontal guide, the raising of the end effector to disengage a substrate carrier from a conveyor, or the lowering of the end effector to hand off the substrate carrier to the conveyor, may be accomplished by raising or lowering the end effector along the vertical guide (e.g., rather than by raising the horizontal guide relative to a pair of vertical guides). An actuator (such as a belt drive or lead screw not shown) may be provided on the support 223 of the substrate carrier handler 215 to raise the end effector 225 relative to the horizontal guide 221 to disengage a substrate carrier from the conveyor 231, or to lower the end effector 225 toward the horizontal guide 221 to hand off the substrate carrier to the conveyor 231 (in addition to or instead of raising/lowering the horizontal guide 221 along a vertical guide or guides).

The present invention may be employed to unload substrate carriers from, and load substrate carriers onto, a conveyor which transports substrate carriers in a vertical orientation. In such a case, the end effector 225 may include a reorientation mechanism for reorienting a substrate carrier between vertical and horizontal orientations, as disclosed in previously incorporated U.S. patent application Ser. No. 60/407,452, filed Aug. 31, 2002, entitled "End Effector Having Mechanism for Reorienting a Wafer Carrier Between Vertical and Horizontal Orientations".

The present invention is illustrated with respect to single substrate carriers, but the present invention may be employed with substrate carriers that hold more than one substrate or with individual substrates that are not transported via carriers.

The particular embodiment of a substrate loading station illustrated herein includes docking stations arranged in a plurality of vertical stacks. However, the above-illustrated substrate loading station may include only one vertical stack of docking stations, only one docking station or more than two vertical stacks of docking stations. The substrate loading station may include one or more storage shelves and/or one or more other substrate carrier storage facilities which are not storage shelves.

In the exemplary substrate loading station illustrated in FIG. 7A, the docking stations are shown to include docking grippers that suspend a substrate carrier to move it between docked and undocked positions. Alternatively the docking stations may include docking sleds or platforms which support a substrate carrier from below, via the substrate carrier's bottom or sides, etc., while moving the substrate carrier between docked and undocked positions.

Preferably, the invention is employed in a substrate loading station that comprises a frame to which the vertical and horizontal guides are coupled. In this manner, the preferred substrate loading station is modular and may be quickly installed and calibrated. In the event the substrate loading station includes one or more storage shelves (e.g., storage shelf 239 in FIG. 2A), each storage shelf also may be mounted on the frame. By mounting both the substrate carrier handler and the storage shelf or shelves to the frame, the substrate carrier handler and storage shelves have a predetermined position relative to each other. This further facilitates installation and calibration, and is another advantage of employing a modular substrate loading station. Similarly, other mechanisms such as dedicated mechanisms for loading and/or unloading substrate carriers from an overhead factory transport system may be advantageously mounted to the frame as described herein with reference to FIG. 2. Alternatively, the frame may comprise two or more separate frames wherein, for example, the substrate or substrate carrier handler is coupled to one of the frames and the shelves are coupled to the other. Such frames may include alignment features to facilitate alignment of the two or more frame parts.

In one aspect, the frame may be mounted to predetermined mounting locations (e.g., predrilled bolt holes, etc.) on the clean room wall, or on the front wall of a chamber (e.g., a factory interface chamber). Preferably, the wall also has predetermined mounting locations to which the docking grippers or docking platforms are mounted. Additionally, the wall may have predetermined mounting locations to which a substrate carrier opening mechanism may be mounted. When the frame, the docking mechanisms, and the substrate carrier opening mechanism are each mounted to predetermined locations on the same surface, the relative positions of each are predetermined, and installation and calibration of the substrate loading station is facilitated.

Although the conveyor described herein has been illustrated as being positioned above the substrate loading station 201, it is alternatively contemplated that the conveyor may be at or below the height of the substrate loading station or at another location positioned adjacent the substrate loading station.

The substrate loading station illustrated herein may be utilized to provide substrates to a processing tool, a metrology location, or any other location to which a substrate may be transported.

From the foregoing description, it will be understood that the inventive substrate loading station may be installed in association with a factory interface (FI) having an FI robot that transfers a substrate from a docking station of the substrate loading station to a load lock chamber of a processing tool (such as in the system of FIG. 1). Alternatively, the factory interface may be eliminated, and the load lock chamber may include a substrate handler that transfers a substrate directly from the docking station of the substrate loading station. As another alternative, the processing tool may operate at atmospheric pressure rather than under vacuum, so that the load lock chamber may be eliminated.

Figure 13A:
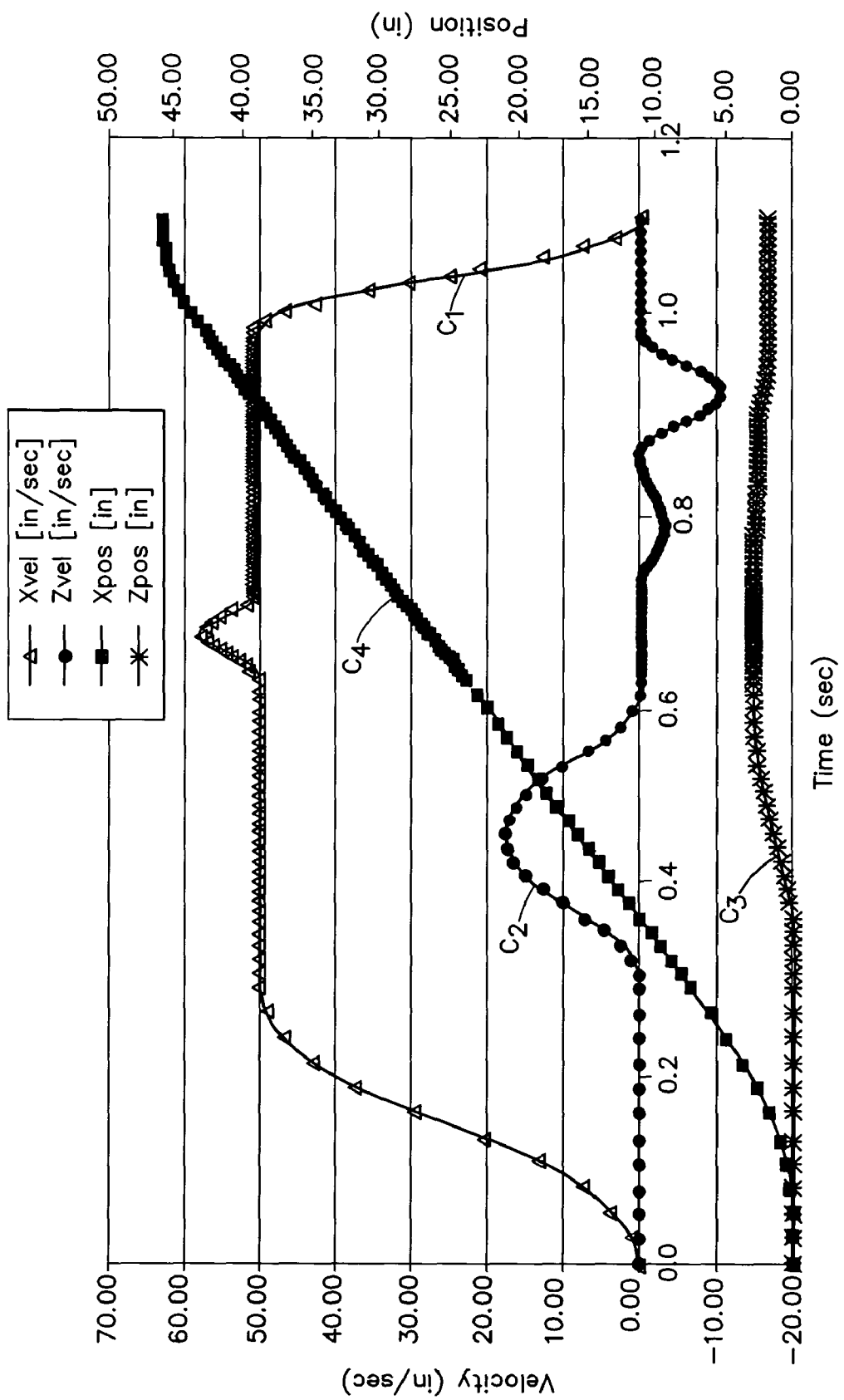
FIGS. 13A–13D are exemplary motion profiles for the end effector of the present invention.
Figure 13B:
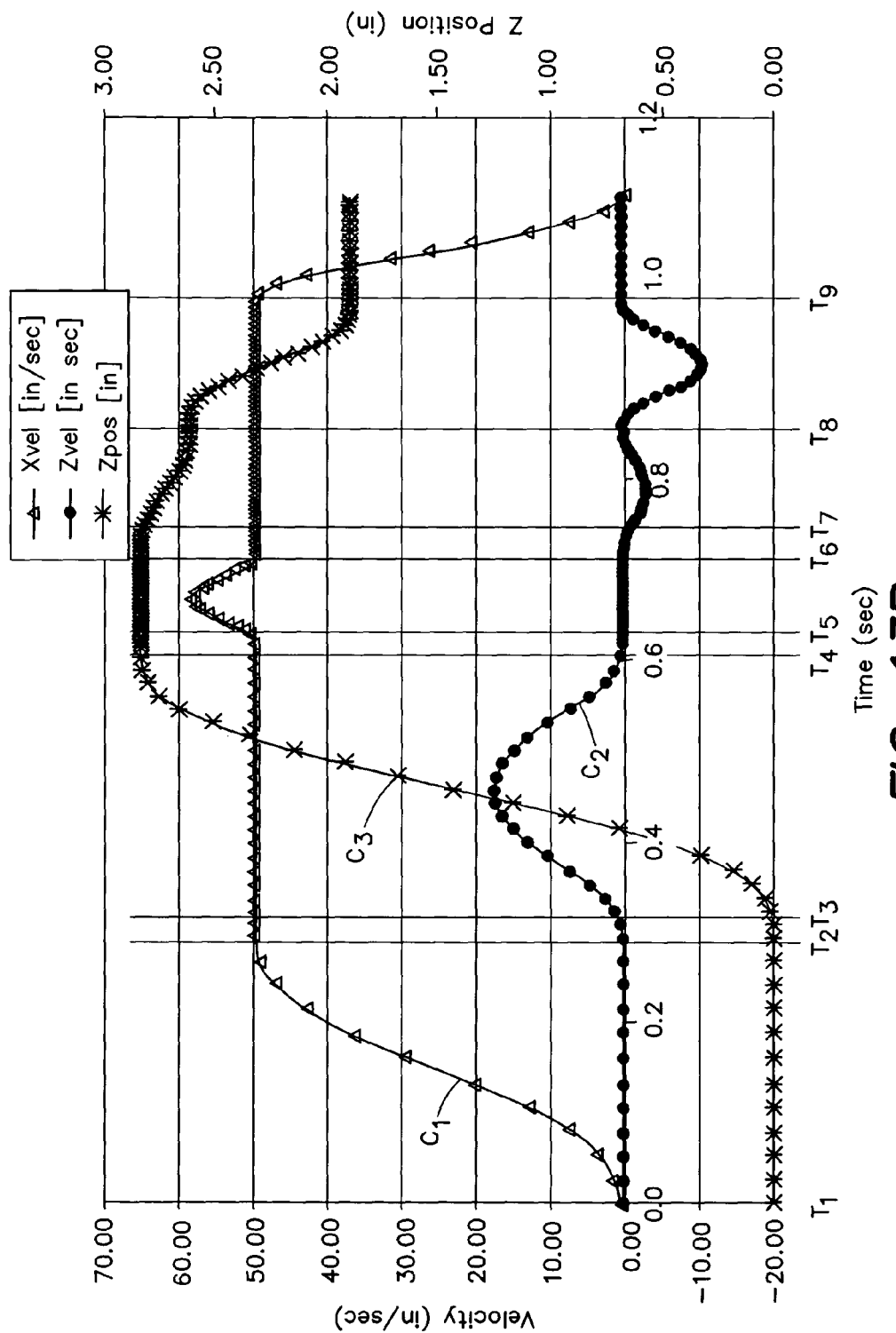
Figure 13C:
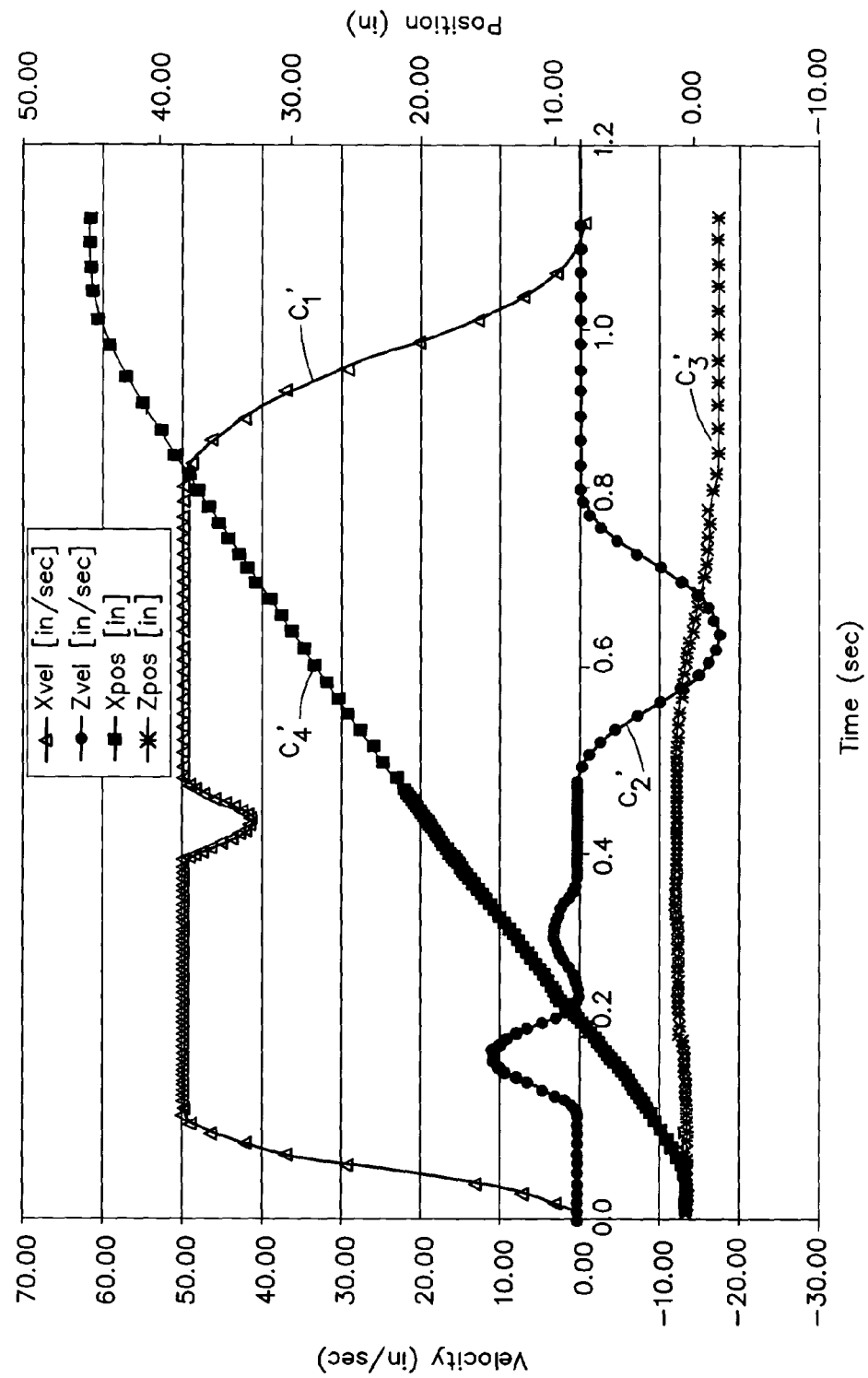
Figure 13D:
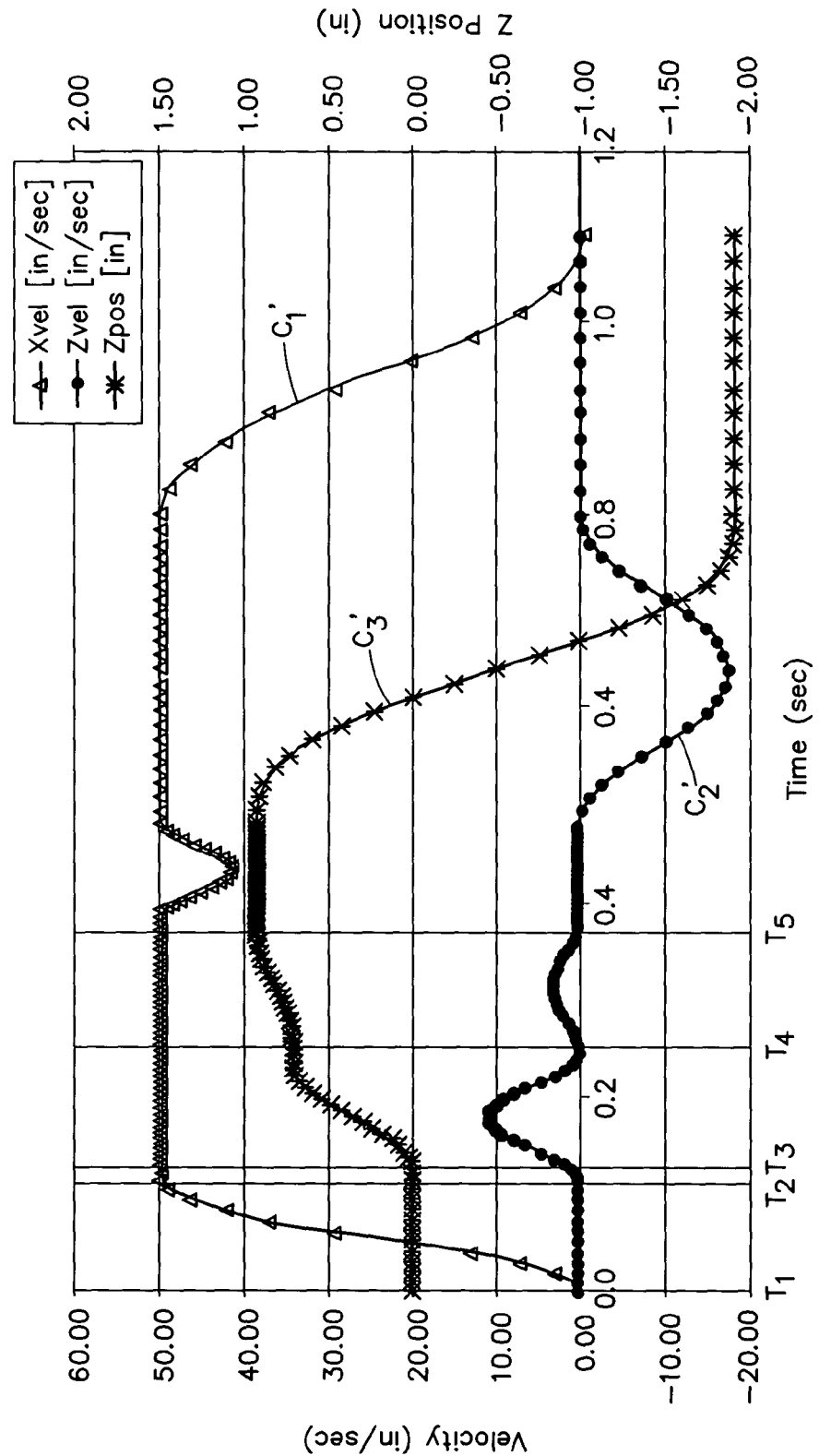

FIGS. 13A–D are exemplary motion profiles for the end effector 225. In at least one embodiment of the invention, when such motion profiles are employed, only the sensor 233 (e.g., a "launch" sensor) need be employed (e.g., the sensor 235 may be eliminated). With reference to FIG. 13A, curve C1 illustrates end effector velocity along the x-axis (horizontal direction in which the conveyor 231 travels) during a load operation. Curve C2 illustrates end effector velocity along the z-axis (vertical direction) during a load operation. Curve C3 illustrates end effector z-axis position and curve C4 illustrates end effector x-axis position during a load operation. FIG. 13B is similar to FIG. 13A, but shows the z-axis position data enlarged. FIGS. 13C–D are similar to FIGS. 13A–B, but illustrate x-axis velocity (curve C1'), z-axis velocity (curve C2'), z-axis position (curve C3') and x-axis position (curve C4') for the end effector 225 during an unload operation. Note that FIGS. 13A–B shows the z-axis position data (curve C3) at a lower z-position during a start of a substrate carrier load operation (e.g., to compensate for the size of a substrate carrier).

With reference to FIGS. 13A–B and curves C1–C4, the end effector 225 may perform similar raisings, lowerings, and accelerations as described with reference to FIG. 10 during a load operation. For example, and with further reference to FIGS. 10 and 11A–E, after receiving a trigger signal for a load operation (step 503), the end effector 225 accelerates to match the velocity of the conveyor 231 in the x-direction (curve C1) between times T1 and T2 (step 505 and FIG. 11A). Thereafter, between times T3 and T4, the end effector 225 (curve C3) is raised to the level of the conveyor 231 (step 511 and FIG. 11B); for example, such that the flange 402 of the substrate carrier 207 to be loaded onto the conveyor 231 is above the carrier engagement member 401 that is to receive the substrate carrier 207.

Between times T5 and T6, the end effector 225 is accelerated (curve C1) above the speed of the conveyor 231 (and then is decelerated back to the speed of the conveyor 231) so that the flange 402 of the substrate carrier 207 is positioned above the carrier engagement member 401 (step 513 and FIG. 11C). At time T7, with the flange 402 of the substrate carrier 207 positioned above the carrier engagement member 401, the end effector 225 lowers (curve C3) and stops as the flange 402 contacts the carrier engagement member 401 (as shown at time T8). The end effector 225 then lowers until time T9 and the substrate carrier 207 remains on the carrier engagement member 401. The substrate carrier 207 thereby is transferred to the conveyor 231 with substantially zero velocity and/or acceleration (e.g., at time T8) (steps 515 and 517 and FIGS. 11D–E). For example, because the end effector 225 stops as the flange 402 engages the carrier engagement member 401, transfer of the substrate carrier 207 occurs with substantially zero velocity and acceleration in the z-direction (curve C2). Likewise, because end effector velocity in the x-direction is constant and matched to that of the conveyor 231 during carrier exchange (curve C1), transfer of the substrate carrier 207 occurs with substantially zero acceleration in the x-direction. Further, in at least one embodiment, no motion occurs in the y-direction during substrate carrier transfer. Accordingly, substrate carrier transfer may be performed with substantially zero acceleration in three directions and substantially zero velocity in at least two directions. Following time T9, the end effector 225 decelerates (step 519 and curve C1).

With reference to FIGS. 13C–D and curves C1–C4, the end effector 225 may perform similar raisings, lowerings, and accelerations as described with reference to FIG. 8 during an unload operation. For example, and with further reference to FIGS. 8 and 9A–E, after receiving a trigger signal for an unload operation (step 303), the end effector 225 accelerates to match the velocity of the conveyor 231 in the x-direction (curve C1') between times T1 and T2 (step 305 and FIG. 9A). Thereafter, between times T3 and T4, the end effector 225 is raised (curve C3') so that the kinematic features 229 engage the concave features 407 of the substrate carrier 207 to be unloaded from the conveyor 231 (step 311 and FIG. 9B). At time T4, the end effector 225 stops raising as the kinematic features 229 engage the concave features 407 (curves C2' and C3'). Between times T4 and T5, the end effector 225 is raised further so as to lift the flange 402 of the substrate carrier 207 off of the carrier engagement member 401 (step 311 and FIG. 9C). The substrate carrier 207 thereby is unloaded from the carrier engagement member 401 with substantially zero velocity and/or acceleration (e.g., in the x, y and/or z-directions due to the halting of z-axis motion at time T4 prior to lifting the substrate carrier 207 from the carrier engagement member 401 and due to speed matching between the end effector 225 and the conveyor 231). Following time T5, the end effector 225 decelerates and reaccelerates (step 313 and curve C1') and lowers (step 315 and curve C3') to clear the carrier engagement member 401 as previously described and as shown in FIGS. 13C–D.

Accordingly, unloading/loading of substrate carriers from/onto a moving conveyor may occur with substantially zero velocity and/or acceleration in one or more directions, more preferably in two directions, and most preferably in all directions. Substantially zero velocity and acceleration in a vertical direction are preferred; and zero velocities and/or accelerations, rather than substantially zero velocities and/or accelerations, during unloading/loading are more preferred. As used herein, "zero velocity" or "zero acceleration" mean as close to zero as possible given system variations such as conveyor height, conveyor speed, actuator repeatability, etc., system limitations such as controller resolution, actuator resolution, end effector position tolerances, etc., and/or the like. "Substantially zero velocity" or "substantially zero acceleration" mean sufficiently close to zero so that a substrate carrier may be unloaded from and/or loaded onto a moving conveyor and/or carrier engagement member without damaging a substrate contained within the substrate carrier and/or generating potentially damaging particles. For example, a substrate carrier may be contacted with a relatively small velocity. In one embodiment, an end effector may raise vertically rapidly, and then slow down to a relatively small or substantially zero velocity prior to contacting a substrate carrier. A similar small (or substantially zero) acceleration also may be employed. Similar load operations may be performed. In one embodiment, substrates or substrate carriers are contacted in a vertical direction with less than about 0.5 G of force, and in another embodiment with less than about 0.15 G of force. Other contact force values may be employed.

While the present invention has been described primarily with reference to unloading/loading substrate carriers that contain only a single wafer carrier from/onto a moving conveyor, it will be understood that substrate carriers that contain multiple substrates similarly may be unloaded from or loaded onto a moving conveyor. Further, the present invention may be employed within systems that transport both single substrate carriers and multiple substrate carriers (e.g., 25 substrate carrier front opening unified pods). Likewise, the present invention may be employed to unload individual substrates from and/or load individual substrates onto a moving conveyor (e.g., substrates that are not contained within a closed substrate carrier). For example, substrates may be transported via a conveyor using an open substrate carrier, a substrate support, a substrate tray or another substrate transport device that allows the end effector 225 (or a modified version thereof) to directly place a substrate on or remove a substrate from the substrate transport device of the conveyor using similar end effector movements and/or motion profiles. Such individual substrates thereby may be transferred to a docking station or other load port, or directly into a load lock chamber and/or processing tool if desired. For example, a substrate may be transferred directly from the end effector 225 to a substrate handling robot of a factory interface and/or processing tool (e.g., via a direct "blade-to-blade" transfer or via an intermediate transfer location). Multiple individual substrates similarly may be unloaded/loaded from/onto a moving conveyor.

The present invention makes it possible to unload individual substrates and/or substrate carriers from a conveyor, and to load individual substrates and/or substrate carriers onto a conveyor, without stopping the conveyor. Consequently, the conveyor can run continuously during operation of the fabrication facility. This may lead to more efficient operation of the fabrication facility, including a reduced total elapsed time for fabricating each substrate, reduced work in progress for a given level of substrate throughput, and a lower manufacturing cost per semiconductor device produced in the fabrication facility.

Although, the substrate carrier transport system 10 is illustrated in conjunction with one fabrication tool, it is contemplated to install the substrate carrier transport system 10 in conjunction with a plurality of fabrication tools and a plurality of kinds of vacuum or non-vacuum fabrication tools and/or other substrate processing equipment such as cleaning, polishing or metrology tools, for example.

Furthermore, it is contemplated that each load/unload mechanism 32 may be dedicated exclusively to loading substrate carriers onto the conveyor 12 or dedicated exclusively to unloading substrate carriers from the conveyor 12; alternatively, it is contemplated to use some or all of the load/unload mechanisms 32 for both loading and unloading of substrate carriers on or from the conveyor 12.

Moreover, the embodiment of FIG. 1 is shown as having two load/unload mechanisms 32 associated with the substrate loading station 26, but it is alternatively contemplated that only one load/unload mechanism 32, or three or more load/unload mechanisms 32, may be associated with a single substrate loading station 26.

While the present invention has been illustrated in connection with embodiments in which the substrate carriers 14 are transported by the conveyor 12 while being suspended from the conveyor 12, it is also contemplated to apply the present invention in connection with a conveyor in which the substrate carriers are not suspended from (e.g., are on top of) the conveyor.

In the embodiment of FIGS. 2–5F, the load/unload mechanisms 32 are shown as including four bar mechanisms 37 on which load/unload members 36 are mounted for movement in a rotary fashion. In embodiments of the invention in which a four-bar linkage is employed that rotates by greater than 180°, the four bars of the linkage may be coupled via a band or other similar mechanism to prevent singularities.

It is contemplated to use other types of rotatable mounting mechanisms besides four bar mechanisms (e.g., rotating arms or other rotatable platforms that may be adapted to unload vertically orientated or horizontally oriented individual substrates or substrate carriers that support a single substrate or a plurality of substrates). Further, it is contemplated that the path of movement of the load/unload member 36 may pursue a curve that is not circular. For example, an elliptical path of movement may be employed.

Any load/unload mechanism, whether it follows a rotary or non-rotary path, may similarly contact an individual substrate or substrate carrier with zero or substantially zero velocity and/or acceleration in one or more directions (preferably stopping or substantially stopping movement in a vertical direction immediately prior to contact) as described with reference to FIGS. 13A–D. For example, a rotary load/unload mechanism may instantaneously or momentarily substantially stop accelerating in one or more directions (e.g., may stop elevating) prior to contacting the substrate or substrate carrier. Further a load/unload mechanism having both a rotary and a non-rotary component (e.g., a rotating four bar platform having lift pins coupled thereto) may be employed so as to exhibit zero or substantially zero velocity and/or acceleration in one or more directions at or just before a time when contact occurs between the load/unload member and the substrate/carrier or between the substrate/carrier and the factory transport agent/system.

The load/unload mechanisms 32 are shown and described above as being associated with a substrate loading station. However, it is alternatively contemplated that a load/unload mechanism 32 may be associated with a load port or docking station for a fabrication tool or other substrate processing equipment without a substrate loading apparatus (i.e., without the substrate handler and optional storage shelves) being present.

Accordingly, while the present invention has been disclosed in connection with the preferred embodiments thereof, it should be understood that other embodiments may fall within the spirit and scope of the invention, as defined by the following claims.

The invention claimed is:

1. A substrate transport system comprising:
    a conveyor adapted to transport a substrate carrier; and
    an unload mechanism adapted to unload the substrate carrier from the conveyor while the conveyor is moving the substrate carrier;
    wherein the unload mechanism is adapted to contact the substrate carrier with substantially zero velocity or zero velocity in a vertical direction as the substrate carrier is transported by the conveyor.

2. The substrate transport system of claim 1, further comprising:
    a controller coupled to the unload mechanism and adapted to raise the unload mechanism while substantially matching a velocity of the unload mechanism to a velocity at which the substrate carrier is transported by the conveyor.

3. The substrate transport system of claim 2 wherein the controller is further adapted to cause the unload mechanism to contact the substrate carrier with substantially zero velocity or zero velocity in a vertical direction as the substrate carrier is transported by the conveyor.

4. The substrate carrier transport system of claim 2, wherein the conveyor includes a plurality of suspension assemblies, each suspension assembly adapted to suspend a respective substrate carrier from the conveyor.

5. The substrate carrier transport system of claim 4, wherein the unload mechanism is adapted to disengage the substrate carrier from one of the suspension assemblies as the unload mechanism is raised.

6. The substrate carrier transport system of claim 1, wherein the substrate carrier is a single substrate carrier.

7. The substrate carrier transport system of claim 1, wherein the unload mechanism is also adapted to load a substrate carrier onto the conveyor as the conveyor is moving.

8. The substrate carrier transport system of claim 2, wherein the unload mechanism is adapted to move in a non-rotary path.

9. A method of operating a substrate carrier transport system, comprising:
    using a conveyor to move a substrate carrier; and
    while the substrate carrier is moving along the conveyor, unloading the substrate carrier from the conveyor by contacting the substrate carrier with substantially zero velocity or zero velocity in a vertical direction as the substrate carrier is transported by the conveyor.

10. The method of claim 9, wherein unloading the substrate carrier from the conveyor comprises moving an unload mechanism so that at a time when the unload mechanism contacts the substrate carrier a velocity of the unload member substantially matches a velocity at which the substrate carrier is moving along the conveyor.

11. The method of claim 10, wherein the unload mechanism contacts the substrate carrier with substantially zero acceleration or zero acceleration.

12. The method of claim 9, further comprising, while the conveyor is moving, loading a substrate carrier onto the conveyor.

13. The method of claim 12, wherein loading the substrate carrier onto the conveyor comprises moving a load mechanism so that at a time when a substrate carrier being transported by the load mechanism contacts the conveyor, a velocity of the substrate carrier substantially matches a velocity at which the conveyor is moving.

14. The method of claim 13, wherein the substrate carrier contacts the conveyor with substantially zero acceleration or zero acceleration.

15. The method of claim 13, wherein a single mechanism functions as the load mechanism and the unload mechanism.

16. A substrate carrier transport system comprising:
    a conveyor adapted to transport a substrate carrier; and
    a load/unload mechanism adapted to unload the substrate carrier from the conveyor while the substrate carrier is moving along the conveyor, and to load the substrate carrier onto the conveyor while the conveyor is moving;
    wherein the load/unload mechanism is adapted to contact the substrate carrier with substantially zero velocity or zero velocity in a vertical direction as the substrate carrier is transported by the conveyor.

17. The substrate carrier transport system of claim 16, wherein the load/unload mechanism is adapted to substantially match velocity between the substrate carrier and the conveyor, and between the substrate carrier and the load/unload mechanism, respectively, at a time of contact.

18. The substrate carrier transport system of claim 17, wherein:
    during loading, the substrate carrier contacts the conveyor with substantially zero acceleration or zero acceleration; and
    during unloading, the load/unload mechanism contacts the substrate carrier with substantially zero acceleration or zero acceleration.

19. The substrate carrier transport system of claim 16, wherein the conveyor includes a plurality of suspension assemblies, each suspension assembly adapted to suspend a respective substrate carrier from the conveyor.

20. A substrate loading station comprising:
    a load port from which a substrate may be loaded to or from a processing tool;
    a load/unload mechanism for loading or unloading substrate carriers to or from a factory transport mechanism, the load/unload mechanism being adapted so as to substantially match a velocity of a substrate carrier moving along the factory transport mechanism when the load/unload mechanism initially contacts the substrate carrier; and
    an apparatus for transporting a substrate carrier between the load/unload mechanism and the load port;
    wherein the load/unload mechanism is adapted to contact a substrate carrier with substantially zero velocity or zero velocity in a vertical direction as the substrate carrier is transported by the conveyor.

21. The substrate loading station of claim 20, further comprising at least one storage shelf for storing a substrate carrier, wherein the apparatus for transporting a substrate carrier between the load/unload mechanism and the load port is further adapted to transport substrate carriers to and from the at least one storage shelf.

22. The substrate loading station of claim 21, wherein the apparatus for transporting a substrate carrier comprises a substrate carrier handler having an end effector and a plurality of linear guides which allow the substrate carrier handler to move vertically and horizontally.

23. The substrate loading station of claim 20, wherein the load/unload mechanism is adapted to contact the substrate carrier with substantially zero acceleration or zero acceleration.

* * * * *